United States Patent
Oh et al.

(10) Patent No.: US 8,922,245 B2
(45) Date of Patent: Dec. 30, 2014

(54) POWER SAVING DRIVER DESIGN

(71) Applicant: Rambus Inc., Sunnyvale, CA (US)

(72) Inventors: Kyung Suk Oh, Cupertino, CA (US);
Chi-Ming Yeung, Cupertino, CA (US);
David A. Secker, San Jose, CA (US)

(73) Assignee: Rambus Inc., Sunnyvale, CA (US)

( * ) Notice: Subject to any disclaimer, the term of this patent is extended or adjusted under 35 U.S.C. 154(b) by 0 days.

(21) Appl. No.: 13/963,122

(22) Filed: Aug. 9, 2013

(65) Prior Publication Data

US 2014/0043069 A1 Feb. 13, 2014

Related U.S. Application Data

(60) Provisional application No. 61/681,735, filed on Aug. 10, 2012.

(51) Int. Cl.
*H03K 3/012* (2006.01)
*G11C 7/10* (2006.01)
*H04L 25/02* (2006.01)
*G11C 11/4074* (2006.01)

(52) U.S. Cl.
CPC .............. *H03K 3/012* (2013.01); *G11C 7/1057* (2013.01); *H04L 25/028* (2013.01); *G11C 11/4074* (2013.01)
USPC ................... 326/59; 326/60; 326/21; 326/22

(58) Field of Classification Search
USPC ............................... 326/21–22, 59–60, 81, 86
See application file for complete search history.

(56) References Cited

U.S. PATENT DOCUMENTS

| | | | |
|---|---|---|---|
| 7,126,378 B2 | 10/2006 | Stojanovic et al. | |
| 7,405,595 B2 * | 7/2008 | Yang et al. | 326/83 |
| 8,027,405 B2 * | 9/2011 | Den Ouden | 375/286 |
| 8,237,466 B2 * | 8/2012 | Cooper | 326/59 |
| 8,513,975 B2 * | 8/2013 | Cooper | 326/59 |
| 2007/0171169 A1 * | 7/2007 | Hirama | 345/94 |
| 2011/0188317 A1 * | 8/2011 | Mui et al. | 365/185.22 |
| 2013/0214816 A1 * | 8/2013 | Thornton et al. | 326/93 |

OTHER PUBLICATIONS

Sredojevic, Ranko et al. "Digital Link Pre-emphasis with Dynamic Driver Impedance Modulation," 2010 IEEE Custom Integrated Circuits Conference (CICC), Sep. 19-22, 2010. 4 pages.

* cited by examiner

*Primary Examiner* — Vibol Tan
(74) *Attorney, Agent, or Firm* — The Neudeck Law Firm, LLC

(57) ABSTRACT

In an asymmetrically terminated communication system, the power consumed to transmit a particular bit value is adjusted based on whether the bit being output is the second, third, fourth, etc. consecutive bit with the same value after a transition to output the particular bit value. The adjustment of the power consumed to transmit the two or more consecutive bits with the same value may be made by adjusting the driver strength during the second, or subsequent, consecutive bits with the same value. The adjustment of the power consumed is performed on the bit value that consumes the most DC power and the other value is typically not adjusted.

20 Claims, 30 Drawing Sheets

SIGNALING A SWITCHING BIT USING A FIRST SIGNALING POWER LEVEL, THE SWITCHING BIT HAVING A FIRST BINARY VALUE AND OCCURRING IN A TIME SERIES OF BITS IMMEDIATELY AFTER A BIT HAVING A SECOND BINARY VALUE
2302

SIGNALING, USING A SECOND SIGNALING POWER LEVEL THAT CONSUMES LESS POWER THAN THE FIRST SIGNALING POWER LEVEL, A FIRST CONSTANT BIT HAVING THE FIRST BINARY VALUE AND OCCURRING IN THE TIME SERIES OF BITS IMMEDIATELY AFTER THE SWITCHING BIT
2304

FIGURE 23

SIGNALING A SWITCHING BIT USING A FIRST SIGNALING POWER LEVEL, THE SWITCHING BIT HAVING A FIRST BINARY VALUE AND OCCURRING IN A TIME SERIES OF BITS OUTPUT BY A SIGNALING SYSTEM IMMEDIATELY AFTER A BIT HAVING A SECOND BINARY VALUE
2402

SIGNALING A FIRST SERIES OF AT LEAST ONE CONSTANT BIT HAVING THE FIRST BINARY VALUE AND OCCURRING IN THE TIME SERIES OF BITS IMMEDIATELY AFTER THE SWITCHING BIT, THE FIRST AT LEAST ONE CONSTANT BIT SIGNALED USING THE FIRST SIGNALING POWER LEVEL
2404

SIGNALING, USING A SECOND SIGNALING POWER LEVEL THAT CONSUMES LESS POWER THAN THE FIRST SIGNALING POWER LEVEL, A SECOND SERIES OF AT LEAST ONE CONSTANT BIT HAVING THE FIRST BINARY VALUE AND OCCURRING IN THE TIME SERIES OF BITS IMMEDIATELY AFTER THE FIRST SERIES OF AT LEAST ONE CONSTANT BIT
2406

FIGURE 24

OUTPUTTING A FIRST SIGNALING LEVEL AND A SECOND SIGNALING LEVEL, THE FIRST SIGNALING LEVEL CONSUMING MORE POWER THAN THE SECOND SIGNALING LEVEL
2502

OUTPUTTING THE FIRST SIGNALING LEVEL AT A FIRST DRIVE STRENGTH TO SIGNAL A FIRST BIT VALUE
2504

BASED ON WHETHER A SECOND BIT VALUE TO BE SIGNALED IS THE SAME AS THE FIRST BIT VALUE, DRIVING THE FIRST SIGNALING LEVEL AT A SECOND DRIVE STRENGTH THAT CONSUMES LESS POWER THAN THE FIRST DRIVE STRENGTH.
2506

FIGURE 25

```
┌─────────────────────────────┐
│   PROVIDING, TO A DRIVER, A │
│     FIRST INDICATOR AND A   │
│    SECOND INDICATOR HAVING  │
│  THE SAME VALUE SUCH THAT A │
│  FIRST SIGNALING VALUE AND A│
│   SECOND SIGNALING VALUE IS │
│   TO BE DRIVEN IN SUCCESSIVE│
│       SIGNALING PERIODS     │
│             2602            │
└──────────────┬──────────────┘
               │
┌──────────────┴──────────────┐
│       BASED ON THE FIRST    │
│   INDICATOR AND THE SECOND  │
│    INDICATOR HAVING THE SAME│
│    VALUE, ADJUSTING A FIRST │
│   DRIVE STRENGTH OF A DRIVER│
│       TO DRIVE THE FIRST    │
│     SIGNALING VALUE WITHOUT │
│    ADJUSTING A SECOND DRIVE │
│   STRENGTH OF THE DRIVER TO │
│    DRIVE A SECOND SIGNALING │
│             VALUE.          │
│             2604            │
└─────────────────────────────┘
```

FIGURE 26

RECEIVING A FIRST INDICATOR AND A SECOND INDICATOR HAVING THE SAME VALUE SUCH THAT A FIRST SIGNALING VALUE AND A SECOND SIGNALING VALUE IS TO BE DRIVEN IN SUCCESSIVE SIGNALING PERIODS
2702

BASED ON THE FIRST INDICATOR AND THE SECOND INDICATOR HAVING THE SAME VALUE, ADJUSTING A FIRST DRIVE STRENGTH OF A DRIVER TO DRIVE THE FIRST SIGNALING VALUE WITHOUT ADJUSTING A SECOND DRIVE STRENGTH OF THE DRIVER TO DRIVE A SECOND SIGNALING VALUE.
2704

FIGURE 27

POWER SAVING DRIVER DESIGN

CROSS-REFERENCE TO RELATED APPLICATIONS

The present application claims the benefit of U.S. Provisional Application Ser. No. 61/681,735, filed Aug. 10, 2012, and titled POWER SAVING DRIVER DESIGN, which is hereby incorporated herein by reference for all purposes.

BRIEF DESCRIPTION OF THE DRAWINGS

FIG. 23 is a flowchart illustrating a seventh embodiment of a method of operating an integrated circuit.

FIG. 24 is a flowchart illustrating an eighth embodiment of a method of operating an integrated circuit.

FIG. 25 is a flowchart illustrating a ninth embodiment of a method of operating an integrated circuit.

FIG. 26 is a flowchart illustrating a tenth embodiment of a method of operating an integrated circuit.

FIG. 27 is a flowchart illustrating a eleventh embodiment of a method of operating an integrated circuit.

DETAILED DESCRIPTION

Various embodiments described herein relate to a system including integrated circuit devices, for example, memory devices and/or at least a memory controller device that controls such memory devices (and methods of operation of these respective devices). In several embodiments, as is described in more detail below, integrated circuit devices communicate information (e.g., commands and addresses, and/or data) by driving/transmitting signals on interconnects between devices. The circuits used to send these signals may be referred to as drivers, transmitter, and/or output circuits. To address signal integrity issues on these interconnects, they may be terminated. These terminations may be symmetric or asymmetric. In a symmetrically terminated interconnect, the same resistance/impedance is used between the terminated node and a power rail as is used between the terminated node and ground. In an asymmetrically terminated interconnect, a different (including open-circuit and non-open circuit) resistance/impedance is used between the terminated node and a power rail as is used between the terminated node and ground.

In an embodiment, in an asymmetrically terminated communication system, the power consumed to transmit (or output) a particular bit value (i.e., a "1" or a "0") is adjusted based on whether the bit being output is the second, third, fourth, etc. consecutive bit with the same value after a transition to output the particular bit value. More generally, the adjustment is made during bit periods when there is not a transition to a preselected bit value. For example, if the preselected bit value is "0", adjustments can be made when two or more consecutive "0"'s are output. Conversely, if the preselected bit value is "1", adjustments can be made when two or more consecutive "1"'s are output. The adjustment of the power consumed to transmit the two or more consecutive bits with the same value may be made by adjusting the driver strength (a.k.a., source termination impedance) during the second, or subsequent, consecutive bits with the same value. The adjustment of the power consumed is typically only done on the bit value that consumes the most DC power and the other value is typically not adjusted. Implementations to accomplish these drive strength adjustments can use finite impulse response (FIR) based equalization. For example, these drive strength adjustments can use FIR-based equalization that, depending on the circuit configuration, is only applied to one of either the high side or the low side. In another example, these drive strength adjustments can use FIR-based equalization that, depending on the circuit configuration, is applied asymmetrically to the high side and the low side. In other words, the FIR-based equalization is applied in unequal amounts to the high side and the low side.

Figure 1:
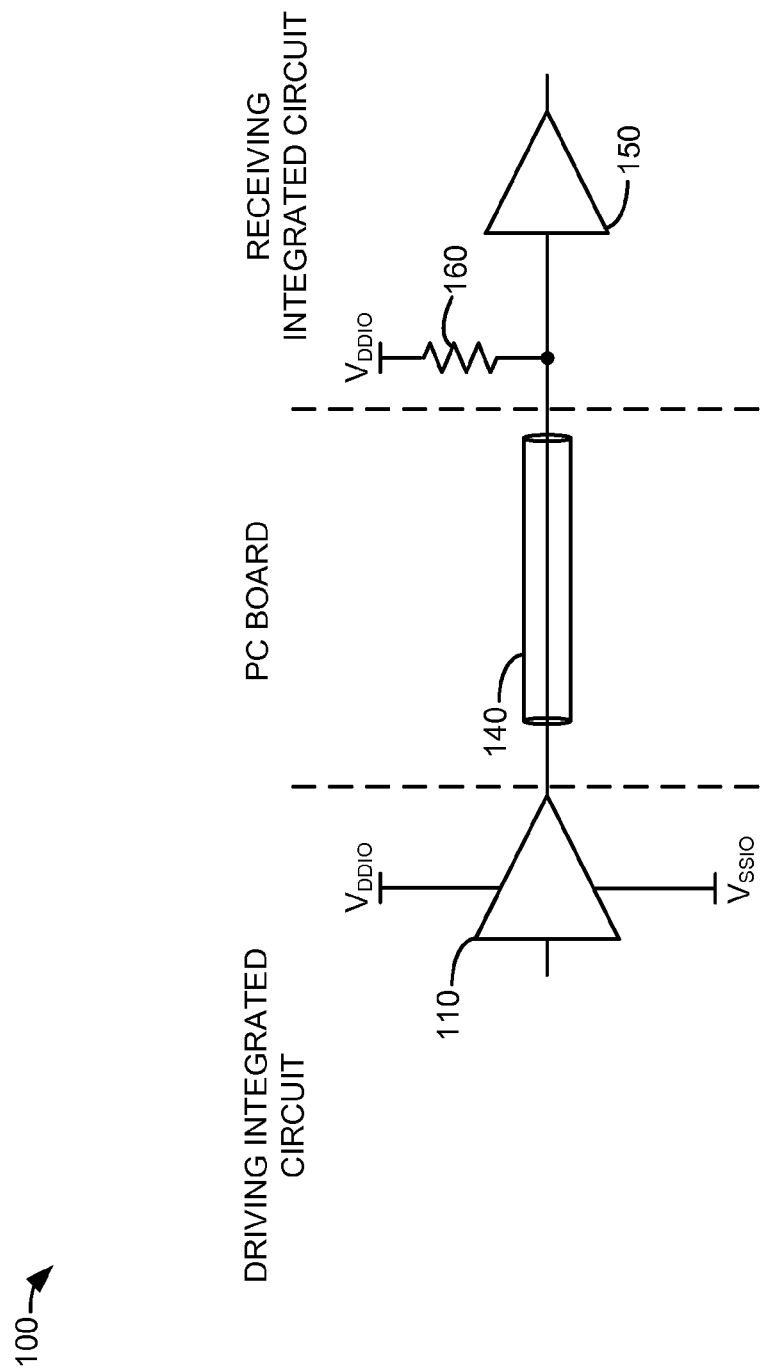
FIG. 1 is a block diagram illustrating an embodiment of a pseudo open drain (POD) signaling system.

FIG. 1 is a block diagram illustrating an embodiment of a pseudo open drain (POD) signaling system. Signaling system 100 comprises a driving integrated circuit, a receiving integrated circuit, and interconnect between them. The driving integrated circuit includes transmitter circuit 110 (a.k.a., a driver). The receiver integrated circuit includes receiver circuit 150 and termination impedance 160. The interconnect between the driving integrated circuit and the receiving integrated circuit comprises interconnect system 140. Interconnect system 140 would typically comprise a printed circuit (PC) board, connector, cable, flex circuit, other substrate, and/or a combination of these. Interconnect system 140 may be and/or include one or more transmission lines. Termination impedance 160 and receiver circuit 150 would typically be part of an integrated circuit that is receiving the signal sent by the driving integrated circuit. In other cases, termination (e.g., termination impedance 360) can be part of interconnect system 340. It should also be understood that although system 100 is illustrated as transmitting a single-ended signal, the signals sent by the driving integrated circuit of system 100 may represent one of a pair of differential signals.

In FIG. 1, the supply terminal of transmitter circuit 110 is connected to power node $V_{DDIO}$. The ground terminal of transmitter circuit 110 is connected to ground node $V_{SSIO}$. The output of transmitter circuit 110 is connected to a first end of interconnect system 140. The second end of interconnect 140 is connected to a first terminal of termination impedance 160. The second terminal of termination impedance 160 is connected to power node $V_{DDIO}$. The second end of interconnect system 140 is also connected to the input of receiver 150.

When transmitter circuit 110 drives its output to $V_{DDIO}$, it can be seen that no direct current (DC) power is consumed. No DC power is consumed because the output of transmitter circuit 110 is pulled up to $V_{DDIO}$ by termination impedance 160 when the driver is turned off. In other words, the output terminal of transmitter circuit 110 is initially driven by transmitter circuit 110. Once the voltage between the output terminal of transmitter circuit 110 and $V_{DDIO}$ decreases sufficiently, transmitter circuit 110 is essentially turned off. Further reduction of the voltage between the output of transmitter circuit 110 and $V_{DDIO}$ is achieved by termination impedance 160. Transmitter circuit 110 is essentially off thus creating an open circuit between $V_{DDIO}$ and $V_{SSIO}$.

When transmitter circuit 110 drives its output to $V_{SSIO}$, it can be seen that DC power is consumed. When the output of transmitter circuit 110 is driven to $V_{SSIO}$ the second terminal of termination impedance 160, after some AC settling, reaches a voltage that is determined by the drive strength (a.k.a., source termination impedance) of transmitter circuit 110. Thus, current flows through termination impedance 160 and transmitter circuit 110 in a voltage divider like configuration that consumes power in order to keep the input to receiver 150 at a specified DC voltage below $V_{DDIO}$. This power is consumed from $V_{DDIO}$, and dissipated in termination impedance 160 and transmitter circuit 110. Transmitter circuit 110 may be implemented using FIR-based equalization applied to just the low side.

Figure 2:
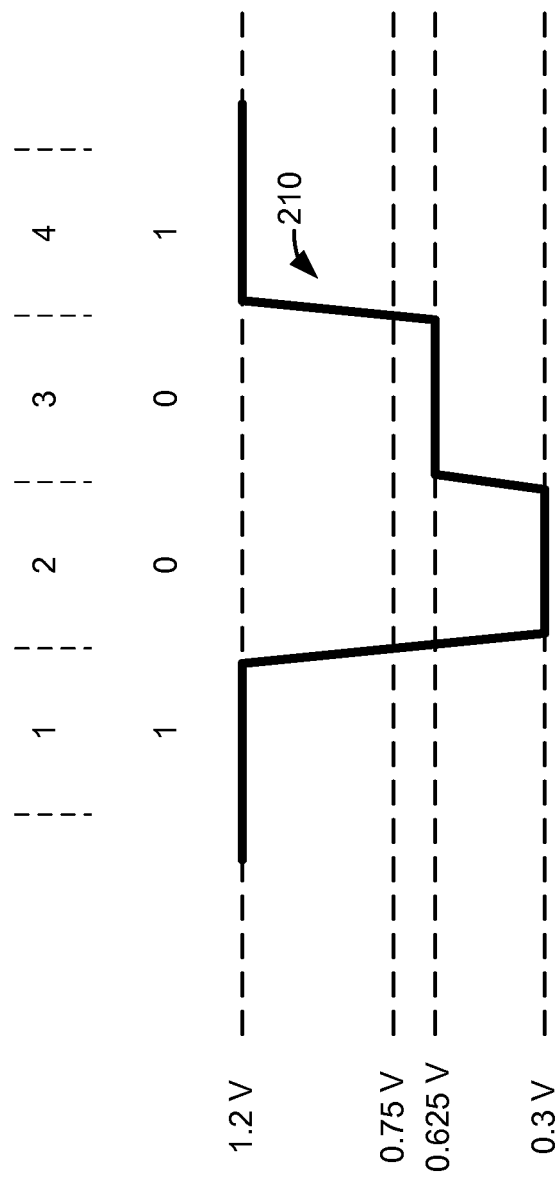
FIG. 2 is a timing diagram illustrating an example power saving pseudo open drain waveform.

FIG. 2 is a timing diagram illustrating an example power saving pseudo open drain waveform. Waveform 210 illustrated in FIG. 2 is an example voltage waveform driven (or output) by transmitter circuit 110 (or received by receiver 150) of system 100 (shown in FIG. 1). In FIG. 2, voltage waveform 210 is shown for four bit periods numbered 1-4. A time series bit sequence of 1001 corresponding to data transmitted during bit periods 1-4, respectively, is shown in FIG. 2. It should be understood that in FIG. 2 the selection of transmitting a signal for a "1"'s being a higher voltage than a signal transmitted for a "0"'s (i.e., active "high" logic) is arbitrary and a voltage to signal a "0" can be higher than a voltage to signal a "1" (i.e., active "low" logic).

In FIG. 2, a voltage of 1.2 V in the waveform during bit period #1 represents the transmission of a logic "1". During bit period #2, a voltage of 0.3 V in the waveform represents a transition to the transmission of a logic "0". During bit period #3, a voltage of 0.625 V in the waveform represents the consecutive transmission of a logic "0". During bit period #4, a voltage of 1.2 V in the waveform represents the transmission of a logic "1".

As can be seen in FIG. 2, to transmit the first logic "0" (i.e., during bit period #2), a drive strength sufficient to cause 0.3 volts to appear at receiver 150 is used. To transmit the second (or consecutive) logic "0", a drive strength sufficient to cause 0.625 volts to appear at receiver 150 is used. Thus, during bit period #3, less power is consumed because the current flowing through termination impedance 160 and transmitter circuit 110 is reduced as compared to bit period #3 (and as compared to the conventional method of driving every bit period representing a logic value with the same drive strength.) The current flowing through termination impedance 160 and transmitter circuit 110 is reduced, because, by Ohm's law, the voltage across transmitter circuit 110 is increased by the increased source termination impedance of transmitter circuit 110 (i.e., decreased drive strength) thereby decreasing the DC current. For the example waveform illustrated in FIG. 2, 7.5 mA of DC current are consumed during bit period #2 and 4.8 mA of DC current are consumed during bit period #3. It should be understood that, with the circuit arrangement shown in FIG. 1, lowering the high-level (i.e., reducing the high level from 1.2V to a lower level—e.g., 1.0V) requires additional current to reduce the high-side swing. Thus, reducing the high-side swing would increase the DC current consumed. Typical FIR-based equalization reduces the swing for both high and low sides. Thus, typical FIR-based equalization can save a power consumption during the low period but burns extra power during the high period. The embodiments described herein can be implemented by applying equalization/swing reduction to only one of the high side or the low side.

Figure 3:
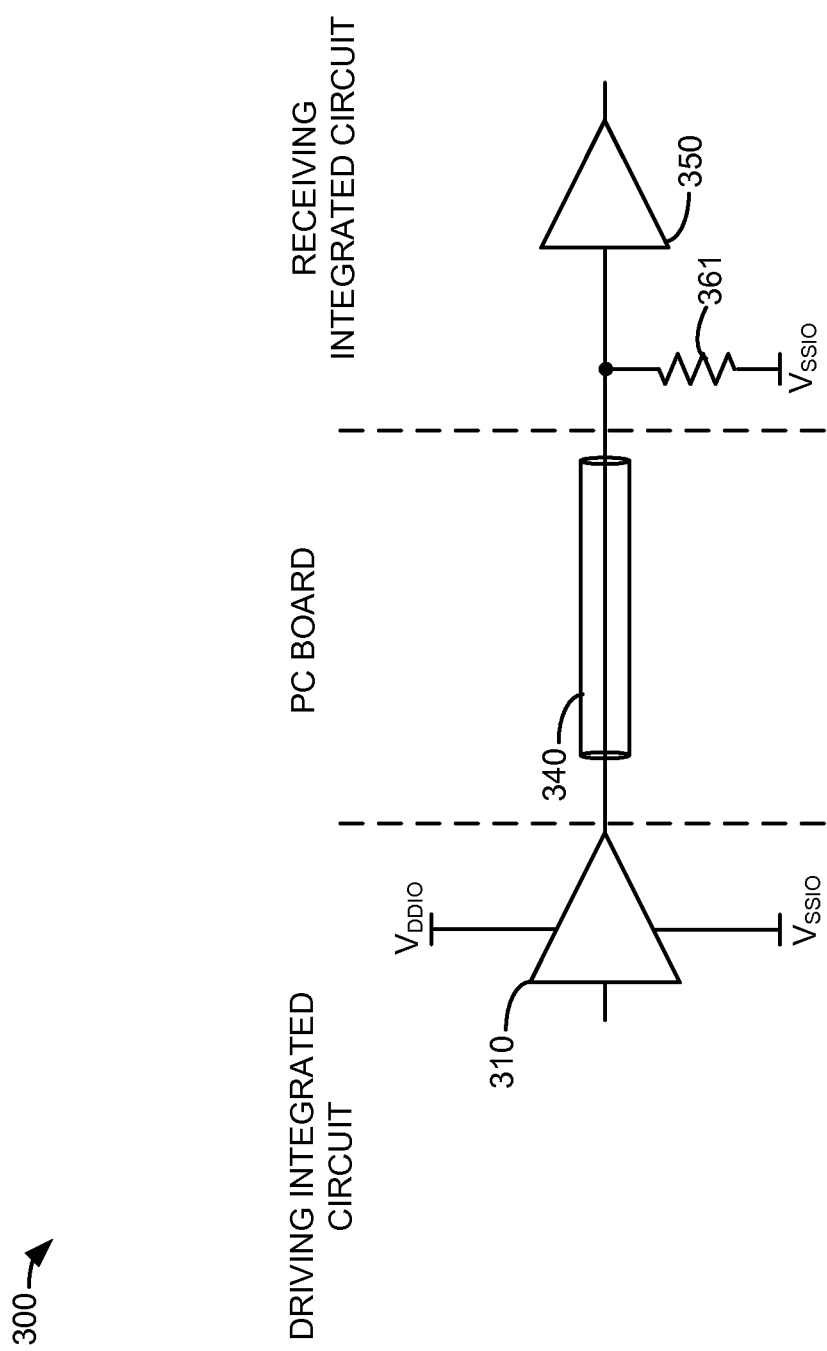
FIG. 3 is a block diagram illustrating an embodiment of a near ground signaling (NGS) system.

FIG. 3 is a block diagram illustrating an embodiment of a near ground signaling (NGS) system. Signaling system 300 comprises a driving integrated circuit, a receiving integrated circuit, and interconnect between them. The driving integrated circuit includes transmitter circuit 310. The receiver integrated circuit includes receiver circuit 350 and termination impedance 361. The interconnect between the driving integrated circuit and the receiving integrated circuit comprises interconnect system 340. Interconnect system 340 would typically be a PC board, other substrate, or combination of both. Interconnect system 340 may be and/or include one or more transmission lines. Termination impedance 361 and receiver circuit 350 would typically be part of an integrated circuit that is receiving the signal sent by the driving integrated circuit. In other cases, termination (e.g., termination impedance 361) can be part of interconnect system 340. It should also be understood, similar to the previous discussion of FIG. 1 and FIG. 2, that although system 300 is illustrated as transmitting a single-ended signal, the signals sent by transmitter circuit 310 of system 300 may represent one of a pair of differential signals.

In FIG. 3, the supply terminal of transmitter circuit 310 is connected to power node $V_{DDIO}$. The ground terminal of transmitter circuit 310 is connected to ground node $V_{SSIO}$. The output of transmitter circuit 310 is connected to a first end of interconnect system 340. The second end of interconnect system 340 is connected to a first terminal of termination impedance 361. The second terminal of termination impedance 361 is connected to ground node $V_{SSIO}$. The second end of interconnect system 340 is also connected to the input of receiver 350.

When transmitter circuit 310 drives its output to $V_{SSIO}$, the output terminal of transmitter circuit 310 is eventually driven to ground by the termination network thereby disabling transmitter circuit 310 and no DC power is consumed. In other words, the output terminal of transmitter circuit 310 is initially driven by transmitter circuit 310. Once the voltage between the output terminal of transmitter circuit 310 and ground decreases sufficiently, transmitter circuit 310 is essentially turned off. Further reduction of the voltage between the output of transmitter circuit 310 and ground is achieved by termination impedance 361. Transmitter circuit 310 is essentially off thus creating an open circuit between $V_{DDIO}$ and $V_{SSIO}$.

When transmitter circuit 310 drives its output to $V_{DDIO}$, it can be seen that DC power is consumed. When the output of transmitter circuit 310 is driven to $V_{DDIO}$ the second terminal of termination impedance 361, after some AC settling, reaches a voltage that is determined by the drive strength (a.k.a., source termination impedance) of transmitter circuit 310. Thus, current flows from $V_{DDIO}$, through transmitter circuit 310 and through termination impedance 361 to $V_{SSIO}$ in a voltage divider like configuration. This consumes power to keep the input to receiver 350 at a specified DC voltage greater than $V_{SSIO}$. This power is consumed from $V_{DDIO}$, and dissipated in termination impedance 361 and transmitter circuit 310. Transmitter circuit 310 may be implemented using FIR-based equalization applied to just the high side.

Figure 4:
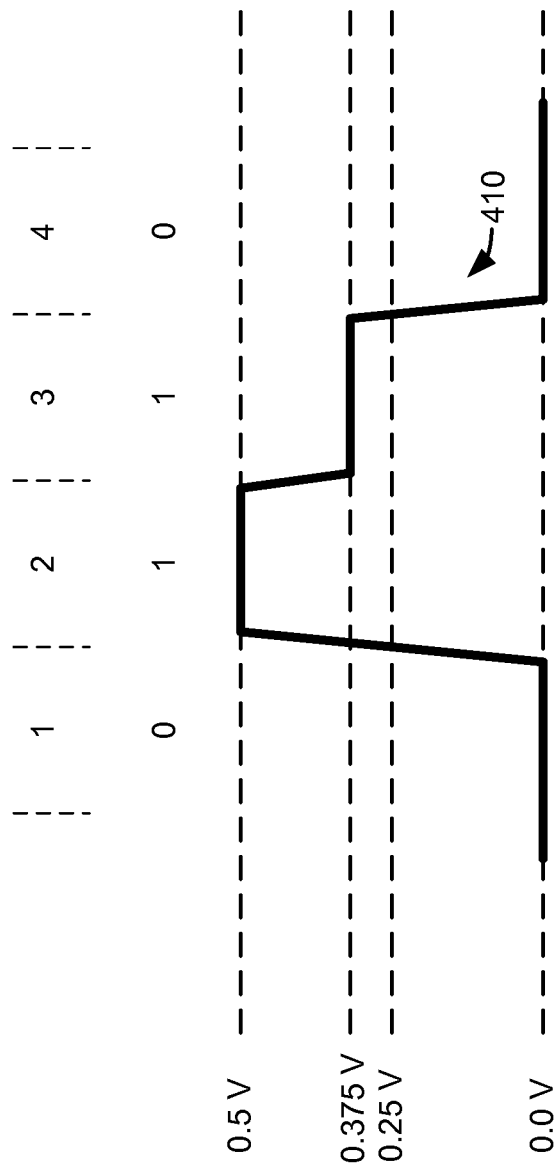
FIG. 4 is a timing diagram illustrating an example power saving near ground signaling waveform.

FIG. 4 is a timing diagram illustrating an example power saving near ground signaling waveform. The waveform illustrated in FIG. 4 is an example voltage waveform driven (or output) by transmitter circuit 310 (or received by receiver 350) of system 300 (shown in FIG. 3). In FIG. 4, a voltage waveform is shown for four bit periods numbered 1-4. A time series bit sequence of 0110 corresponding to data transmitted during bit periods 1-4, respectively, is shown in FIG. 4. It should be understood that, like FIG. 2, the selection of active "high" logic is arbitrary and the waveform of FIG. 4 (or FIG. 2) is applicable to active "low" logic.

In FIG. 4, a voltage of 0.0 V in the waveform during bit period #1 represents the transmission of a logic "0". During bit period #2, a voltage of 0.5 V in the waveform represents a transition to the transmission of a logic "1". During bit period #3, a voltage of 0.375 V in the waveform represents the consecutive transmission of a logic "1". During bit period #4, a voltage of 0.0 V in the waveform represents the transmission of a logic "0".

As can be seen in FIG. 4, to transmit the first logic "1" (i.e., during bit period #2), a drive strength sufficient to cause 0.5 volts to appear at receiver 350 is used. To transmit the second (or consecutive) logic "1", a drive strength sufficient to cause 0.375 volts to appear at receiver 350 is used. Thus, during bit period #3, less power is consumed because the current flowing through transmitter circuit 310, and thereby flowing through termination impedance 361 is reduced as compared to bit period #2 (and as compared to the conventional method of driving every bit period representing a logic value with the same drive strength.) The current flowing through transmitter circuit 310 and termination impedance 361 and is reduced, because, by Ohm's law, the voltage across transmitter circuit 310 is increased by the increased source termination impedance of transmitter circuit 310 (i.e., decreased drive strength) thereby decreasing the voltage across termination impedance 361.

Figure 5:
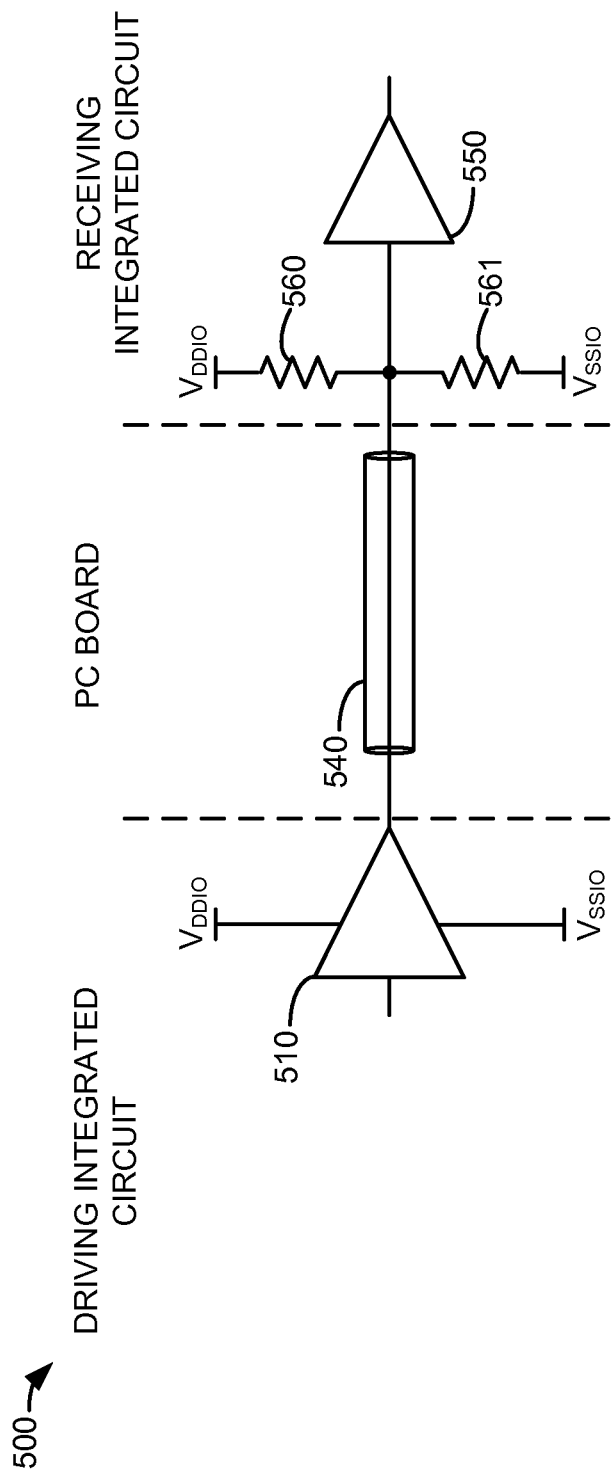
FIG. 5 is a block diagram illustrating an embodiment of an asymmetrically terminated signaling system.

FIG. 5 is a block diagram illustrating an embodiment of an asymmetrically terminated signaling system. Signaling system 500 comprises a driving integrated circuit, a receiving integrated circuit, and interconnect between them. The driving integrated circuit includes transmitter circuit 510. The receiver integrated circuit includes receiver circuit 550, termination impedance 560, and termination impedance 561. The interconnect between the driving integrated circuit and the receiving integrated circuit comprises interconnect system 540. Interconnect system 540 would typically be a PC board, other substrate, or combination of both. Interconnect system 540 may be and/or include one or more transmission lines. Termination impedance 560, termination impedance 561, and receiver circuit 550 would typically be part of an integrated circuit that is receiving the signal sent by the driving integrated circuit. In other cases, termination (e.g., one or more of termination impedance 560 and termination impedance 561) can be part of interconnect system 540. It should also be understood that although system 500 is illustrated as transmitting a single-ended signal, the signals sent by transmitter circuit 510 of system 500 may represent one of a pair of differential signals. System 500 is referred to as asymmetrically terminated because termination impedance 560 and termination impedance 561 are not substantially equal.

In FIG. 5, the supply terminal of transmitter circuit 510 is connected to power node $V_{DDIO}$. The ground terminal of transmitter circuit 510 is connected to ground node $V_{SSIO}$. The output of transmitter circuit 510 is connected to a first end of interconnect system 540. The second end of interconnect system 540 is connected to a first terminal of termination impedance 560. The second terminal of termination impedance 560 is connected to power node $V_{DDIO}$. The second end of interconnect system 540 is connected to a first terminal of termination impedance 561. The second terminal of termination impedance 561 is connected to ground node $V_{SSIO}$. The second end of interconnect system 540 is also connected to the input of receiver 550.

When transmitter circuit 510 drives its output towards $V_{DDIO}$, it can be seen that a first additional amount of DC power determined by termination impedance 560, termination impedance 561, and the drive strength of transmitter circuit 510, is consumed. Additional DC power is consumed because the output of transmitter circuit 510 is driven towards $V_{DDIO}$. This causes the input node of receiver 550 (which is also the first terminal of termination impedance 560 and the first terminal of termination impedance 561) to move above a voltage level determined by the resistor divider network of termination impedance 560 and termination impedance 561 when transmitter circuit 510 is in a high impedance (i.e., tri-state) state. This consumes additional power to keep the input to receiver 550 at a specified DC voltage greater than voltage level determined by the resistor divider network of termination impedance 560 and termination impedance 561. This additional power is consumed from $V_{DDIO}$, and dissipated in termination impedance 561 and transmitter circuit 510.

When transmitter circuit 510 drives its output towards $V_{SSIO}$, it can be seen that a second additional amount of DC power determined by termination impedance 560, termination impedance 561, and the drive strength of transmitter circuit 510, is consumed. Additional DC power is consumed because the output of transmitter circuit 510 is driven towards $V_{SSIO}$. This causes the input node of receiver 550 to move above a voltage level determined by the resistor divider network of termination impedance 560 and termination impedance 561 when transmitter circuit 510 is in a high impedance (i.e., tri-state) state. This consumes additional power to keep the input to receiver 550 at a specified DC voltage less than voltage level determined by the resistor divider network of termination impedance 560 and termination impedance 561. This additional power is consumed from $V_{DDIO}$, and dissipated in termination impedance 560 and transmitter circuit 510. Transmitter circuit 510 may be implemented using FIR-based equalization that is asymmetrically applied when compared between the high side and the low side.

Figure 6:
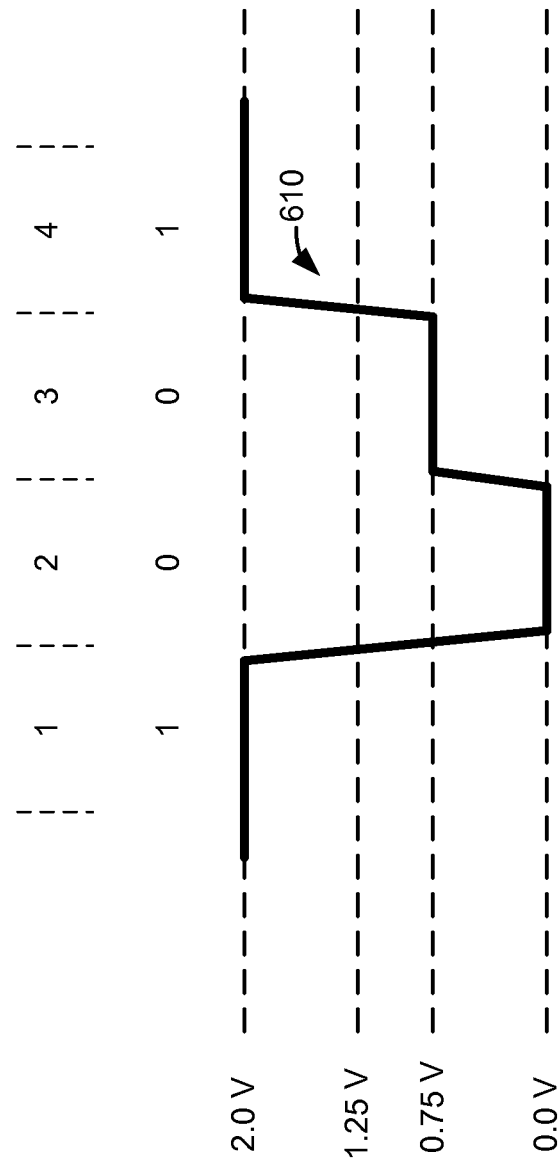
FIG. 6 is a timing diagram illustrating an example power saving asymmetrically terminated signaling system waveform.

FIG. 6 is a timing diagram illustrating an example power saving asymmetrically terminated signaling waveform. FIG.

6 illustrates a case where, of the bit two bit values, the one with the higher current consumption is selected for a weaker drive in certain circumstances and at certain times in order to reduce current consumption as compared to always driving both bit values at full strength (or as compared to always driving the higher current consumption bit value at full strength). The waveform illustrated in FIG. 6 is an example voltage waveform driven (or output) by transmitter circuit 510 (or received by receiver 550) of system 500 (shown in FIG. 5). In FIG. 6, the voltage level determined by the resistor divider network of termination impedance 560 and termination impedance 561 when transmitter circuit 510 is in a high impedance state is shown as 1.25V. Thus, when transmitter circuit 510 drives its output away from that voltage, power is consumed. However, in the example illustrated in FIG. 6, more power is consumed to drive the output of transmitter circuit 510 to near 0.0V than to drive the output of transmitter circuit 510 to near 2.0V.

In other words, assuming $V_{DDIO}$ is 2.0V and $V_{SSIO}$ is 0.0V, to achieve a voltage level of 1.25V when transmitter circuit 510 is in a high impedance state, termination impedance 560 is less than termination impedance 561. Thus, when transmitter circuit 510 is driving its output strongly towards 2.0V (i.e., essentially a DC short circuit to $V_{DDIO}$), there is approximately a DC 2.0V across termination impedance 560. Similarly, when transmitter circuit 510 is driving its output strongly towards 0.0V (i.e., essentially a DC short circuit to $V_{SSIO}$), there is approximately a DC 2.0V across termination impedance 561. Since in both of these DC cases, there is approximately 2.0V across termination impedances 560 and 561, the case with the lower of the two impedances (i.e., pulling down to 0.0V) will consume more current.

In addition, when transmitter circuit 510 is using a weaker drive strength (i.e., not essentially a short circuit as compared to termination impedance 561), there will be less than DC 2.0V across termination impedance 561 (e.g., DC 1.25 V). Since there is less than DC 2.0V across termination impedance 561, less DC current will be consumed when the weaker drive strength is used when compared to a drive strength that is essentially a DC short circuit to $V_{SSIO}$. Thus, as described below, FIG. 6 illustrates a case where, of the bit two bit values, the one with the higher current consumption is selected for a weaker drive in certain circumstances in order to reduce current consumption as compared to always driving both bit values at full strength.

In FIG. 6, a voltage waveform is shown for four bit periods numbered 1-4. A time series bit sequence of 1001 corresponding to data transmitted during bit periods 1-4, respectively, is shown in FIG. 6. It should be understood that the selection of active "high" logic is arbitrary and the waveform of FIG. 6 is applicable to active "low" logic.

In FIG. 6, a voltage of 2.0 V in the waveform during bit period #1 represents the transmission of a logic "1". During bit period #2, a voltage of 0.0 V in the waveform represents a transition to the transmission of a logic "0". During bit period #3, a voltage of 0.75 V in the waveform represents the consecutive transmission of a logic "0". During bit period #4, a voltage of 2.0 V in the waveform represents the transmission of a logic "1".

As can be seen in FIG. 6, to transmit the first logic "0" (i.e., during bit period #2), a drive strength sufficient to cause 0.0 volts to appear at receiver 550 is used. To transmit the second (or consecutive) logic "0", a drive strength sufficient to cause 0.75 volts to appear at receiver 550 is used. Thus, during bit period #3, less power is consumed because the current flowing through transmitter circuit 510 and thereby termination impedance 560 and is reduced as compared to bit period #2. The current flowing through transmitter circuit 510 and termination impedance 560 and is reduced, because, by Ohm's law, the voltage across transmitter circuit 510 is increased by the increased source termination impedance of transmitter circuit 510 (i.e., decreased drive strength) thereby decreasing the voltage across termination impedance 560.

Figure 7:
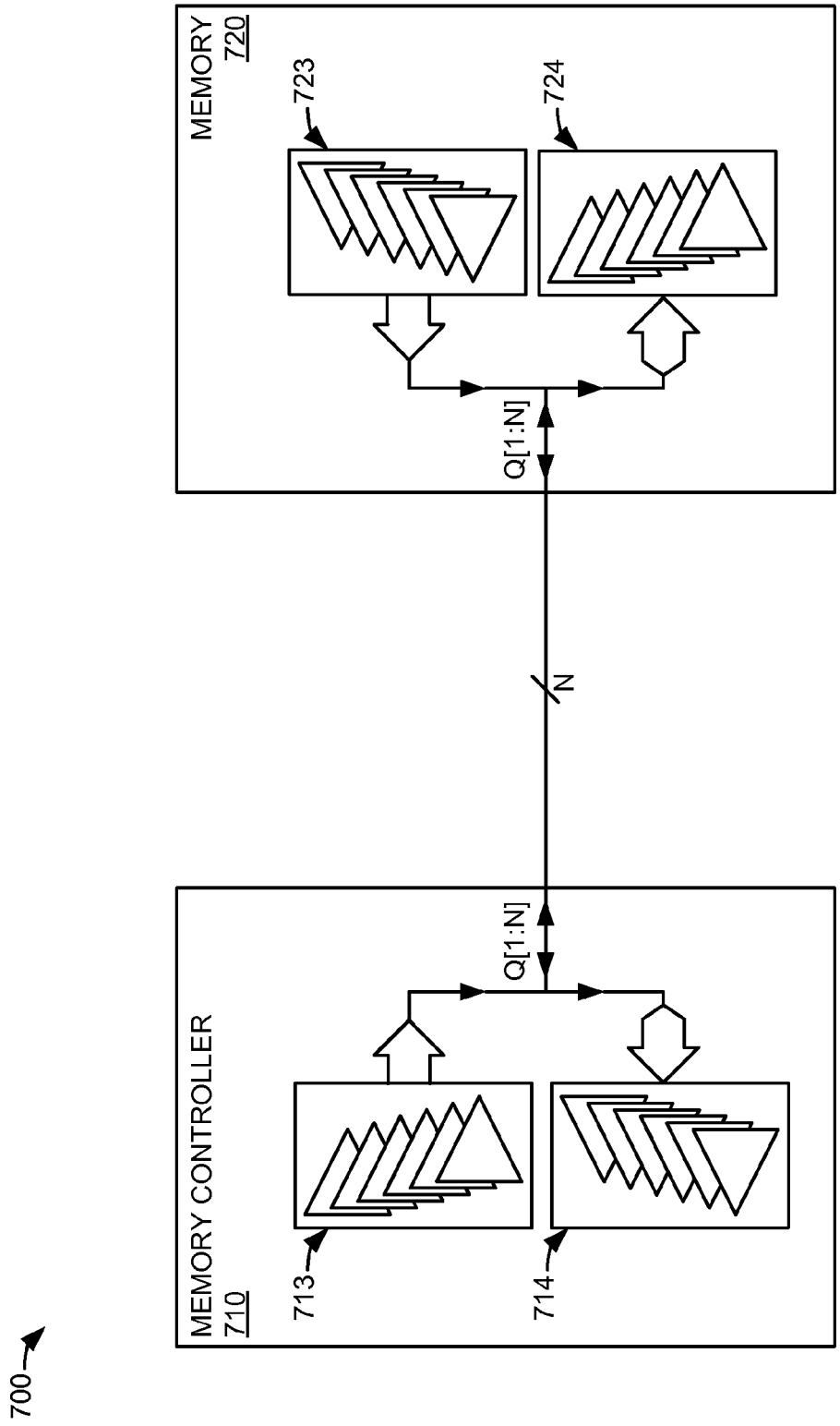
FIG. 7 is a block diagram illustrating a memory system.

FIG. 7 is a block diagram illustrating an embodiment of a memory system. In FIG. 7, memory system 700 comprises memory controller 710 and memory 720. Memory controller 710 includes drivers 713 and receivers 714. Memory controller 710 also includes N number of signal ports Q[1:N] that may be driven by one or more of drivers 713 and may receive signals to be sampled by one or more of receivers 714. Memory 720 includes drivers 723 and receivers 724. Memory 720 also includes N number of signal ports Q[1:N] that may be driven by one or more of drivers 723 and may receive signals to be sampled by one or more of receivers 724. Signal ports Q[1:N] of memory controller 710 are operatively coupled to ports Q[1:N] of memory 720, respectively. Receivers 724 of memory 720 may receive one or more of the Q[1:N] signals from memory controller 710. Receivers 714 of memory controller 710 may receive one or more of the Q[1:N] signals from memory 720.

One or more of drivers 713 when coupled with a corresponding one or more receivers 724 may form a POD signaling system, NGS system, or an asymmetrically terminated signaling system. Thus, one or more of drivers 713 of memory controller 710 may correspond to transmitter circuit 110, transmitter circuit 310, or transmitter circuit 510, discussed previously. In these cases, the one or more of drivers 713 of memory controller 710 may output a power saving pseudo open drain waveform as discussed in relation to FIG. 2, a power saving near ground signaling waveform as discussed in relation to FIG. 4, or a power saving asymmetrically terminated signaling system waveform as discussed in relation to FIG. 6, respectively, or any subsequent Figures discussed herein.

Likewise, one or more of drivers 723 when coupled with a corresponding one or more receivers 714 may form a POD signaling system, NGS system, or an asymmetrically terminated signaling system. Thus, one or more of drivers 723 of memory 720 may correspond to transmitter circuit 110, transmitter circuit 310, or transmitter circuit 510, discussed previously. In these cases, the one or more of drivers 723 of memory 720 may output a power saving pseudo open drain waveform as discussed in relation to FIG. 2, a power saving near ground signaling waveform as discussed in relation to FIG. 4, or a power saving asymmetrically terminated signaling system waveform as discussed in relation to FIG. 6, respectively, or any subsequent Figures discussed herein.

Memory controller 710 and memory 720 are integrated circuit type devices, such as one commonly referred to as a "chip". A memory controller, such as memory controller 710, manages the flow of data going to and from memory devices, such as memory 720. For example, a memory controller may be a northbridge chip, an application specific integrated circuit (ASIC) device, a graphics processor unit (GPU), a system-on-chip (SoC) or an integrated circuit device that includes many circuit blocks such as ones selected from graphics cores, processor cores, and MPEG encoder/decoders, etc. Memory 720 can include a dynamic random access memory (DRAM) core or other type of memory cores, for example, static random access memory (SRAM) cores, or non-volatile memory cores such as flash. In addition although the embodiments presented herein describe memory controller and components, the instant apparatus and methods may also apply to chip interfaces that effectuate signaling between separate integrated circuit devices.

It should be understood that signal ports Q[1:N] of both memory controller 710 and memory 720 may correspond to any input or output pins (or balls) of memory controller 710 or memory 720 that transmit information between memory controller 710 and memory 720. For example, signal ports Q[1:N] can correspond to bidirectional data pins (or pad means) used to communicate read and write data between memory controller 710 and memory 720. The data pins may also be referred to as "DQ" pins. Thus, for a memory 720 that reads and writes data up to 16 bits at a time, signal ports Q[1:N] can be seen as corresponding to pins DQ[0:15]. In another example, signal ports Q[1:N] can correspond to one or more unidirectional command/address (C/A) bus. Signal ports Q[1:N] can correspond to one or more unidirectional control pins. Thus, signal ports Q[1:N] on memory controller 710 and memory 720 may correspond to pins such as CS (chip select), a command interface that includes timing control strobes such as RAS and CAS, address pins A[0:P] (i.e., address pins carrying address bits), DQ[0:X] (i.e., data pins carrying data bits), etc., and other pins in past, present, or future devices.

Figure 8:
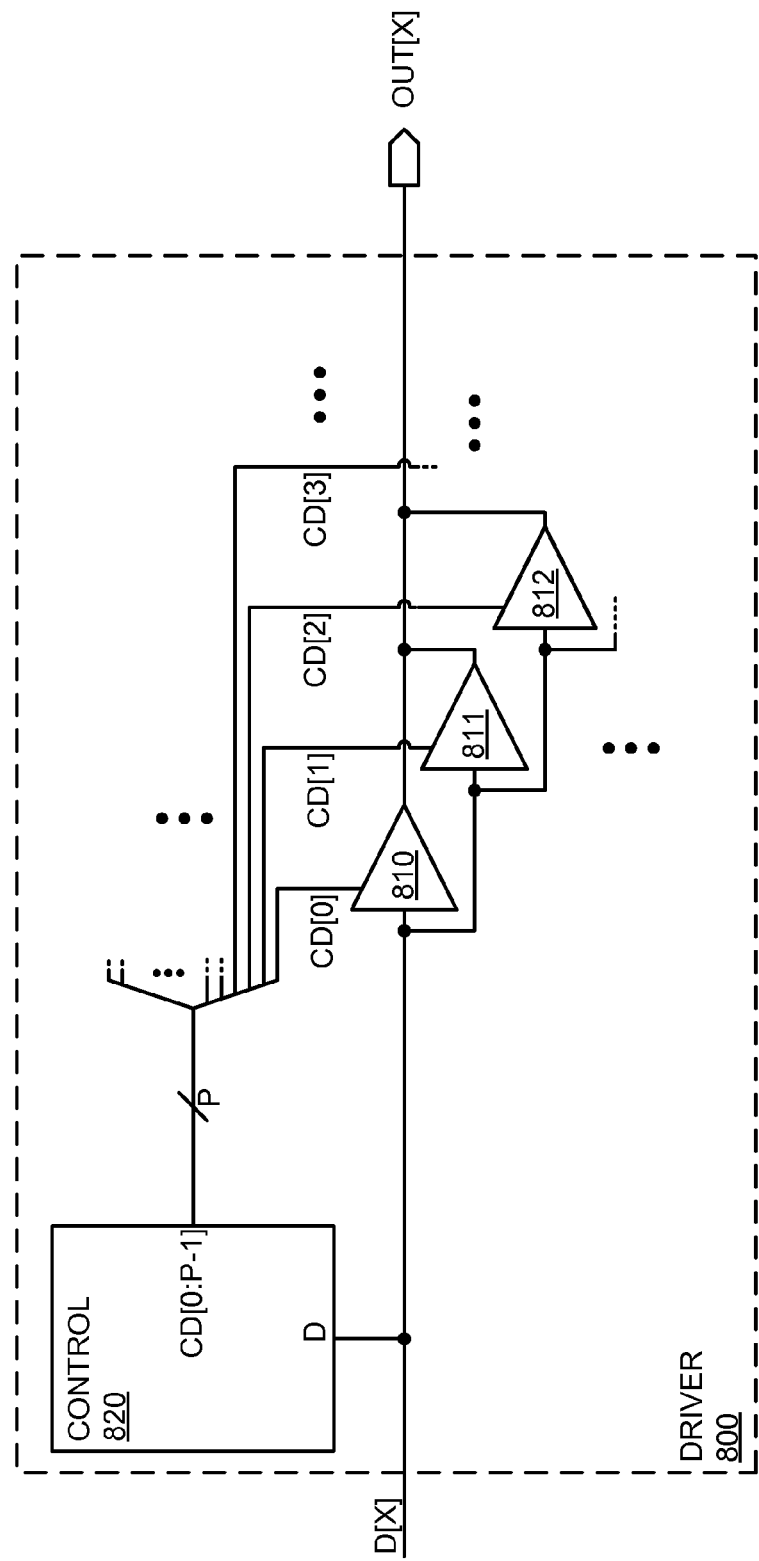
FIG. 8 is a block diagram illustrating a variable strength driver.

FIG. 8 is a block diagram illustrating a variable strength driver. Driver 800 may be transmitter circuit 110, transmitter circuit 310, transmitter circuit 510. Driver 800 comprises a plurality of output drivers 810-812 and control 820. Each of drivers 810-812 receives a value from input port D[X], to output to the output of driver 800, OUT[X]. Control 820 sends a code (CD[0:P−1]) having P number of bits to output driver 810-812 (where P is the number of output drivers 810-813). Each bit of CD[0:P−1] controls one of output drivers 810-812 to turn on or off. Thus, it can be seen that the drive strength, of driver 800 is controlled by control 820. Control 820 is able to dynamically change CD[0:P−1] in response to D[X], and/or one or more previous values of D[X]. This allows control 820 to configure driver 800 to operate in the manners described herein, and/or output any of the waveforms described herein. It should be understood that the parallel drivers 810-812 under the control of control 820 form a segmented digital-to-analog converter (DAC). Control 820 may, for example, control driver 800 to implement FIR-based equalization that, depending on the circuit configuration, is only applied to one of either the high side or the low side. In another example, drive strength adjustments implemented by control 820 can use FIR-based equalization that, depending on the circuit configuration, is applied asymmetrically to the high side and the low side. Control 820 may, for example, be programmed to select the FIR-based equalization applied. Control 820 may, for example, be programmed to select the FIR-based equalization applied based on which of the high side and the low side consume more power.

Figure 9:
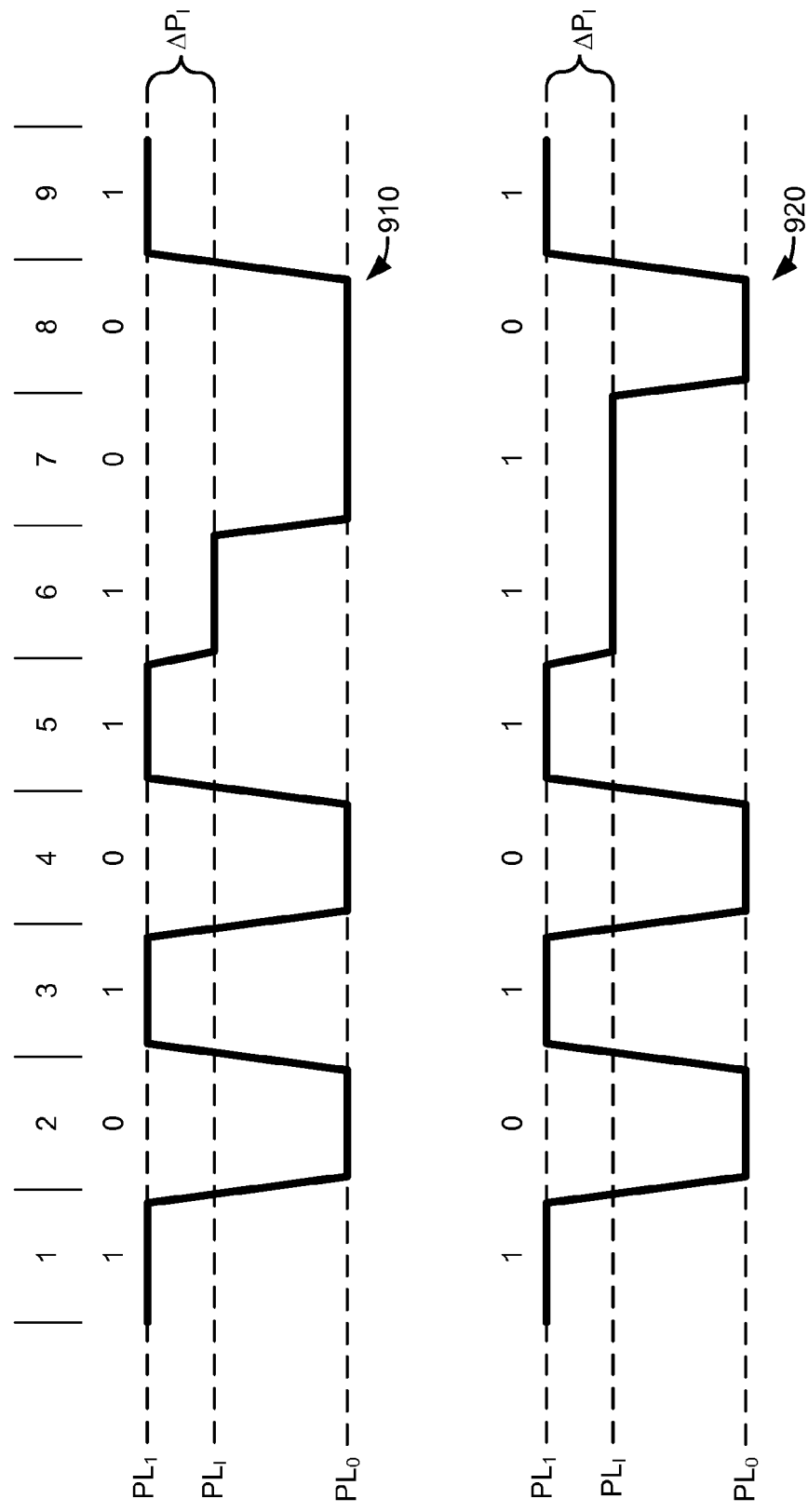
FIG. 9 is a timing diagram illustrating power consumptions of a signaling system.

FIG. 9 is a timing diagram illustrating power consumptions of a signaling system. A first waveform 910 illustrated in FIG. 9 may be an example of the power consumption of a waveform driven (or output) by driver 800. In FIG. 9, a power consumption waveform 910 is shown for 9 bit periods numbered 1-9. A time series bit sequence of 101011001 corresponding to bit periods 1-9, respectively, is shown in FIG. 9. In FIG. 9, waveform 910 is as follows: (1) during bit period #1, when a logical "1" is being transmitted, waveform 910 is at power level #1 ($PL_1$); (2) during bit period #2, when a logical "0" is being transmitted, waveform 910 is at power level #0 ($PL_0$); (3) during bit period #3, when a logical "1" is being transmitted immediately after a logical "0" was transmitted, waveform 910 is at $PL_1$; (4) during bit period #4, when a logical "0" is being transmitted, waveform 910 is at $PL_0$; (5) during bit period #5, when a logical "1" is being transmitted is being transmitted immediately after a logical "0" was transmitted, waveform 910 is at $PL_1$; (6) during bit period #6, when a logical "1" is being transmitted and is not being transmitted immediately after a logical "0" was transmitted (i.e., there was no "0" to "1" transition between bit period #5 and bit period #6), waveform 910 is at an intermediate power level ($PL_I$) that is greater than $PL_0$ and less than $PL_1$ by an amount of power $\Delta P_I$; (7) during bit period #7, when a logical "0" is being transmitted, waveform 910 is at $PL_0$; (8) during bit period #8, when a logical "0" is being transmitted immediately after a logical "0" was transmitted, waveform 910 is at $PL_0$; and, (9) during bit period #5, when a logical "1" is being transmitted is being transmitted immediately after a logical "0" was transmitted, waveform 910 is at $PL_1$.

Thus, it can be seen from waveform 910 that driver 800 may transmit signals to indicate a time sequence of binary valued bits where a first binary value consumes more power to signal than the second binary value (i.e., $PL_1 > PL_0$). Control 800 may detect that a first bit having the first binary value and a second bit also having the first binary value are received by driver 800 (or are transmitted by driver 800) in succession in the time sequence of binary valued bits (e.g., the consecutive logical "1"'s in bit periods #5 and #6). In response to detecting that the first bit and the second bit both have the first binary value, and are received in succession, control 800 may control drivers 810-812 to output a signal to indicate the second bit that consumes less power than a signal used to signal the first bit (i.e., $PL_I$ in bit period #6, where $PL_I < PL_0$).

A second waveform 920 illustrated in FIG. 9 may be an example of the power consumption of a waveform driven (or output) by driver 800. In FIG. 9, a power consumption waveform 920 is shown for 9 bit periods numbered 1-9. A time series bit sequence of 101011101 corresponding to bit periods 1-9, respectively, is shown in FIG. 9. In FIG. 9, waveform 920 is as follows: (1) during bit period #1, when a logical "1" is being transmitted, waveform 920 is at power level #1 ($PL_1$); (2) during bit period #2, when a logical "0" is being transmitted, waveform 920 is at power level #0 ($PL_0$); (3) during bit period #3, when a logical "1" is being transmitted immediately after a logical "0" was transmitted, waveform 920 is at $PL_1$; (4) during bit period #4, when a logical "0" is being transmitted, waveform 920 is at $PL_0$; (5) during bit period #5, when a logical "1" is being transmitted is being transmitted immediately after a logical "0" was transmitted, waveform 920 is at $PL_1$; (6) during bit period #6, when a logical "1" is being transmitted and is not being transmitted immediately after a logical "0" was transmitted (i.e., there was no "0" to "1" transition between bit period #5 and bit period #6), waveform 920 is at an intermediate power level ($PL_I$) that is greater than $PL_0$ and less than $PL_1$ by an amount of power $\Delta P_I$; (7) during bit period #7, when a logical "1" is being transmitted and is not being transmitted immediately after a logical "0" was transmitted (i.e., there was no "0" to "1" transition between bit period #6 and bit period #7), waveform 920 is at $PL_I$; (8) during bit period #8, when a logical "0" is being transmitted immediately after a logical "0" was transmitted, waveform 920 is at $PL_0$; and, (9) during bit period #5, when a logical "1" is being transmitted is being transmitted immediately after a logical "0" was transmitted, waveform 920 is at $PL_1$.

It can be seen from waveform 920 that driver 800 may signal, using a first signaling power level (e.g., $PL_1$), a first bit having a first binary value (e.g., a logical "1") and occurring in a time series of binary valued bits immediately after a bit having a second binary value (e.g., a logical "0"). Driver 800 may also then signal, using a second signaling power level that consumes less power than the first signaling power level (e.g., $PL_I$), a second bit having the first binary value when that bit occurs immediately after the first bit (or any number of bits having the first binary value).

Figure 10:
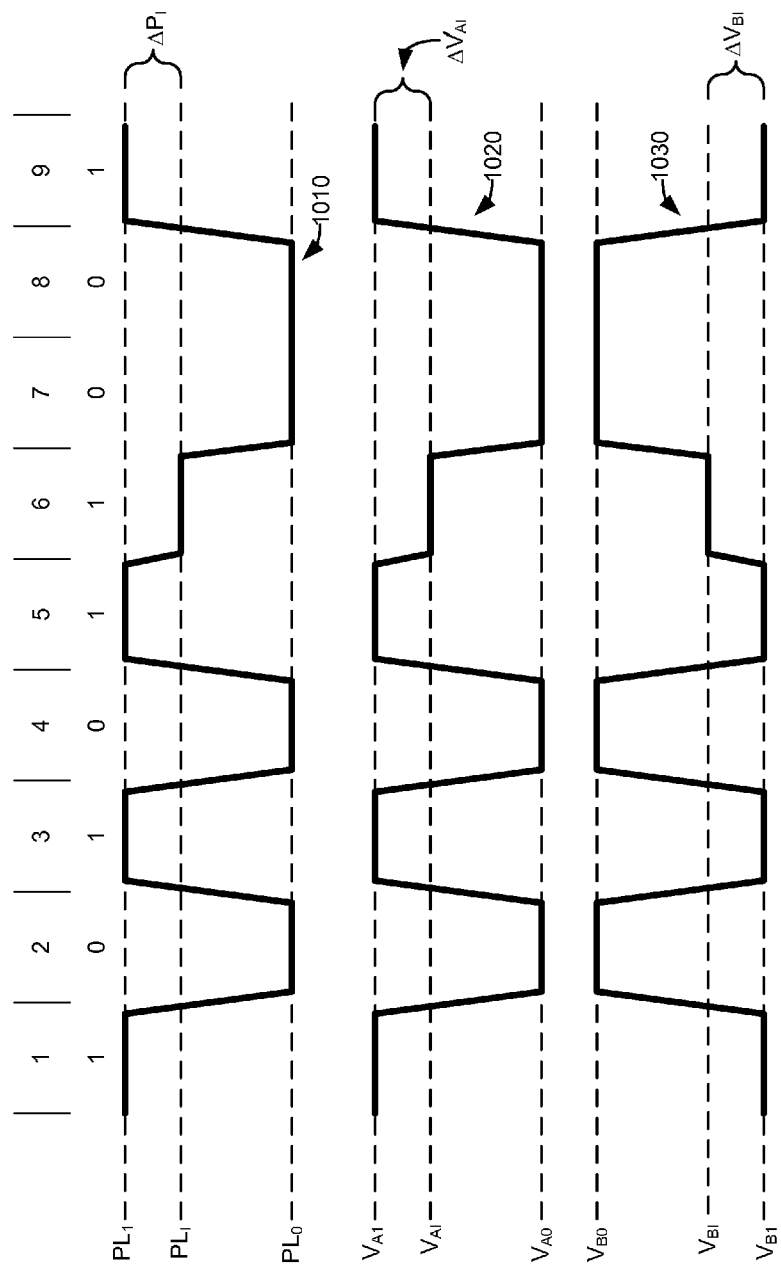
FIG. 10 is a timing diagram illustrating power consumption and signaling voltages of signaling systems.

FIG. 10 is a timing diagram illustrating power consumption and signaling voltages of signaling systems. A first waveform 1010 illustrated in FIG. 10 may be an example of the power consumption of a waveform driven (or output) by driver 800. The power consumption of waveform 1010 may correspond to the voltage waveforms 1020 or 1030 also illustrated in FIG. 10. Voltage waveforms 1020 and 1030 may correspond to signaling levels driven by driver 800. Voltage waveform 1020 may be, for example, a NGS waveform. Voltage waveform 1030 may be, for example, a POD waveform.

In FIG. 10, power consumption waveform 1010 and voltage waveforms 1020 and 1030 are shown for 9 bit periods numbered 1-9. A time series of bit sequence of 101011001 corresponding to bit periods 1-9, respectively, is shown in FIG. 10.

In FIG. 10, waveform 1010 is shown as follows: (1) during bit period #1, when a logical "1" is being transmitted, waveform 1010 is at power level #1 ($PL_1$); (2) during bit period #2, when a logical "0" is being transmitted, waveform 1010 is at power level #0 ($PL_0$); (3) during bit period #3, when a logical "1" is being transmitted immediately after a logical "0" was transmitted, waveform 1010 is at $PL_1$; (4) during bit period #4, when a logical "0" is being transmitted, waveform 1010 is at $PL_0$; (5) during bit period #5, when a logical "1" is being transmitted is being transmitted immediately after a logical "0" was transmitted, waveform 1010 is at $PL_1$; (6) during bit period #6, when a logical "1" is being transmitted and is not being transmitted immediately after a logical "0" was transmitted (i.e., there was no "0" to "1" transition between bit period #5 and bit period #6), waveform 1010 is at an intermediate power level ($PL_I$) that is greater than $PL_0$ and less than $PL_1$ by an amount of power $\Delta P_I$; (7) during bit period #7, when a logical "0" is being transmitted, waveform 1010 is at $PL_0$; (8) during bit period #8, when a logical "0" is being transmitted immediately after a logical "0" was transmitted, waveform 1010 is at $PL_0$; and, (9) during bit period #5, when a logical "1" is being transmitted is being transmitted immediately after a logical "0" was transmitted, waveform 1010 is at $PL_1$.

In FIG. 10, waveform 1020 is shown as follows: (1) during bit period #1, when a logical "1" is being transmitted, waveform 1020 is at signal level #1 ($V_{A1}$); (2) during bit period #2, when a logical "0" is being transmitted, waveform 1020 is at voltage level #0 ($V_{A0}$); (3) during bit period #3, when a logical "1" is being transmitted immediately after a logical "0" was transmitted, waveform 1020 is at $V_{A1}$; (4) during bit period #4, when a logical "0" is being transmitted, waveform 1020 is at $V_{A0}$; (5) during bit period #5, when a logical "1" is being transmitted is being transmitted immediately after a logical "0" was transmitted, waveform 1020 is at $V_{A1}$; (6) during bit period #6, when a logical "1" is being transmitted and is not being transmitted immediately after a logical "0" was transmitted (i.e., there was no "0" to "1" transition between bit period #5 and bit period #6), waveform 1020 is at an intermediate (power saving) voltage level ($V_{AI}$) that is greater than $V_{A0}$ and less than $V_{A1}$ by $\Delta V_{AI}$; (7) during bit period #7, when a logical "0" is being transmitted, waveform 1020 is at $V_{A0}$; (8) during bit period #8, when a logical "0" is being transmitted immediately after a logical "0" was transmitted, waveform 1020 is at $V_{A0}$; and, (9) during bit period #5, when a logical "1" is being transmitted is being transmitted immediately after a logical "0" was transmitted, waveform 1020 is at $V_{A1}$. It should be noted that $V_{A1}$ is greater than $V_{A0}$. In other words, waveform 1020 is illustrating a power saving "active high" signaling.

In FIG. 10, waveform 1030 is shown as follows: (1) during bit period #1, when a logical "1" is being transmitted, waveform 1030 is at signal level #1 ($V_{B1}$); (2) during bit period #2, when a logical "0" is being transmitted, waveform 1030 is at voltage level #0 ($V_{B0}$); (3) during bit period #3, when a logical "1" is being transmitted immediately after a logical "0" was transmitted, waveform 1030 is at $V_{B1}$; (4) during bit period #4, when a logical "0" is being transmitted, waveform 1030 is at $V_{B0}$; (5) during bit period #5, when a logical "1" is being transmitted is being transmitted immediately after a logical "0" was transmitted, waveform 1030 is at $V_{B1}$; (6) during bit period #6, when a logical "1" is being transmitted and is not being transmitted immediately after a logical "0" was transmitted (i.e., there was no "0" to "1" transition between bit period #5 and bit period #6), waveform 1030 is at an intermediate (power saving) voltage level ($V_{BI}$) that is greater than $V_{B1}$ by $\Delta V_{BI}$, and less than $V_{B0}$; (7) during bit period #7, when a logical "0" is being transmitted, waveform 1030 is at $V_{B0}$; (8) during bit period #8, when a logical "0" is being transmitted immediately after a logical "0" was transmitted, waveform 1030 is at $V_{B0}$; and, (9) during bit period #5, when a logical "1" is being transmitted is being transmitted immediately after a logical "0" was transmitted, waveform 1030 is at $V_{B1}$. It should be noted that $V_{A1}$ is greater than $V_{A0}$. In other words, waveform 1020 is illustrating a power saving "active low" signaling.

Figure 11:
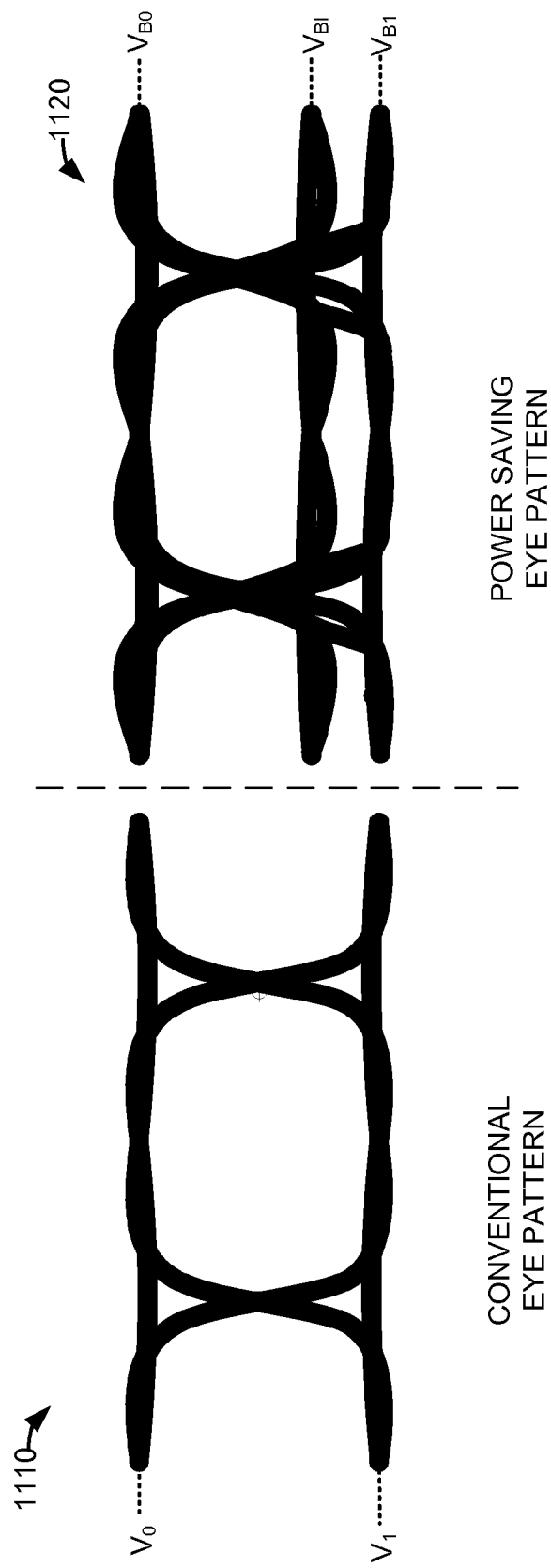
FIG. 11 is an illustration of a conventional eye pattern and a power saving signaling eye pattern.

FIG. 11 is an illustration of a conventional eye pattern and a power saving signaling eye pattern. In FIG. 11, eye pattern 1110 is shown switching between two voltages $V_0$ and $V_1$. Power saving eye pattern 1120 is shown with three distinct voltages, $VB_0$, $VB_I$, and $VB_1$. Thus, power saving eye pattern 1120 has a narrower eye (i.e., between $VB_I$ and $VB_0$) as compared to the conventional eye pattern (which eye is between $V_0$ and $V_1$). However, the location of the top of the eye is the same (i.e., $V_0$ and $V_{B0}$ are substantially the same).

Figure 12:
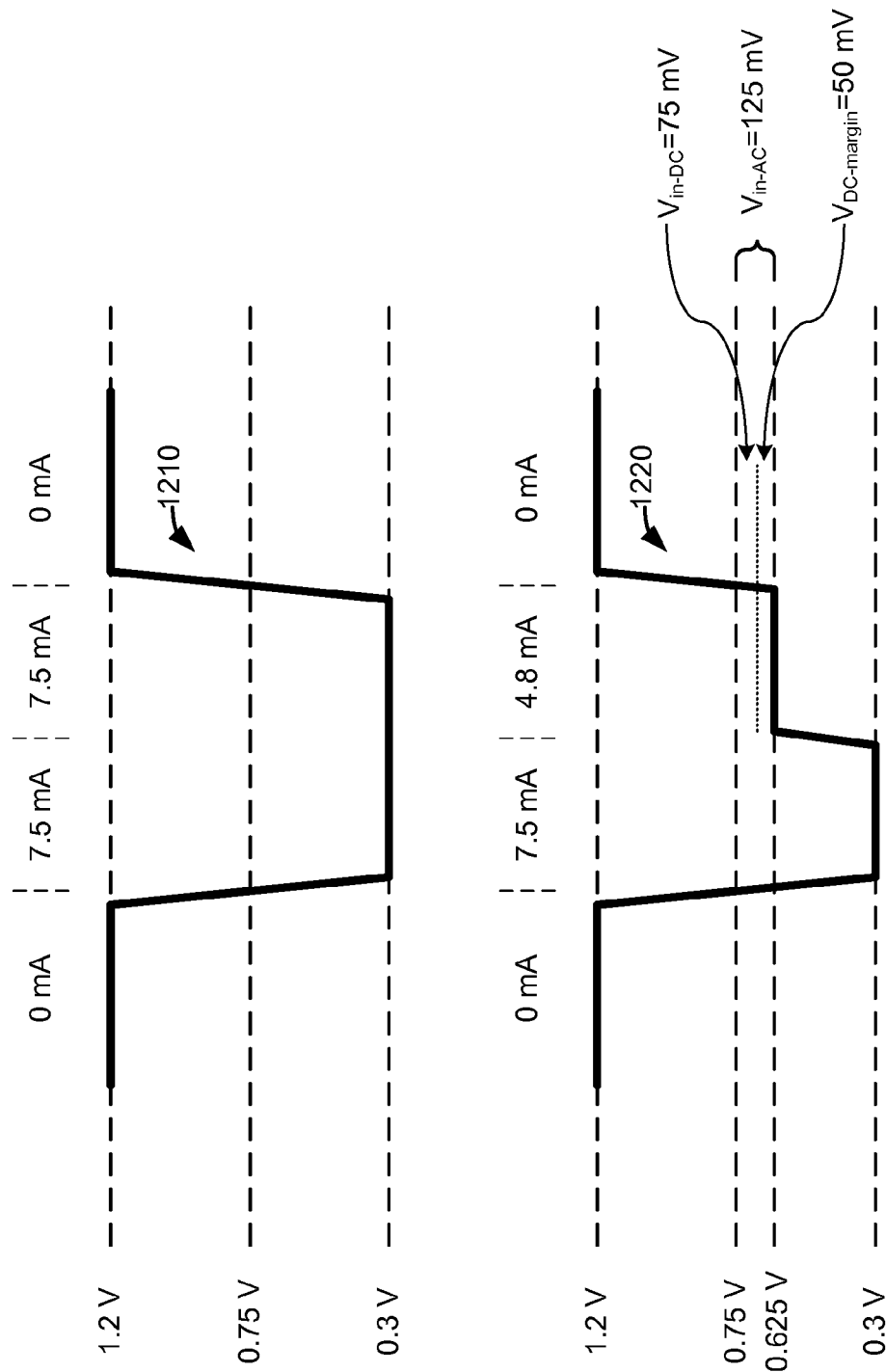
FIG. 12 is a timing diagram for comparing the power consumption of conventional and power saving signaling.

FIG. 12 is a timing diagram for comparing the power consumption of conventional and power saving signaling. In FIG. 12, waveform 1210 illustrates the power consumption of conventional signaling with a pseudo open drain type signaling system terminated to 1.2V. A voltage of 1.2 V in waveform 1210 during a first bit period results in a zero current consumption (and therefore a power consumption of 1.2V*0 A=0 W). During a second and third periods, a voltage of 0.3 V in the waveform results in a current consumption of 7.5 mA (and therefore a power consumption of 1.2V*7.5 mA=9 mW). During a fourth bit period, the voltage of 1.2 V again results in a current consumption of 0 mA.

In FIG. 12, waveform 1220 illustrates the power consumption of power saving signaling. A voltage of 1.2 V in waveform 1220 during a first bit period results in a current consumption of 0 mA (and therefore a power consumption of 0 W). During a second bit period, a voltage of 0.3 V in the waveform results in a current consumption of 7.5 mA (and therefore a power consumption of 9 mW). During a third bit period, because this bit period is not immediately following a transition from 1.2 V to 0.3 V (or zero power consumption to non-zero power consumption), a voltage of 0.625 in the waveform results in a current consumption of 4.8 mA (and therefore a power consumption of 1.2V*4.8 mA=5.76 mW). During a fourth bit period, the voltage of 1.2 V again results in a current consumption of 0 mA. Thus, it can be seen that waveform 1220 consumes the same amount of power as waveform 1210 in the first, second, and fourth bit periods, but consumes less power/current during the third bit period.

Also shown in FIG. 12 are $V_{in-DC}$, $V_{in-AC}$, and $V_{DC-margin}$. $V_{in-AC}$ is the specified voltage level that waveform 1220 needs to reach during a transition from 1.2 V to 0.3 volts in order for the binary value signaled by the 0.3 V to be received correctly. $V_{in-DC}$ is the specified voltage level that waveform 1220 needs to maintain volts during the rest of bit time. Therefore, $V_{in-DC}$ is also the required voltage level for the non-switching consecutive bits. $V_{DC-margin}$ is the difference between the 0.625 V used to signal a second consecutive binary value signaled by the previous 0.3 V of waveform 1220.

Figure 13:
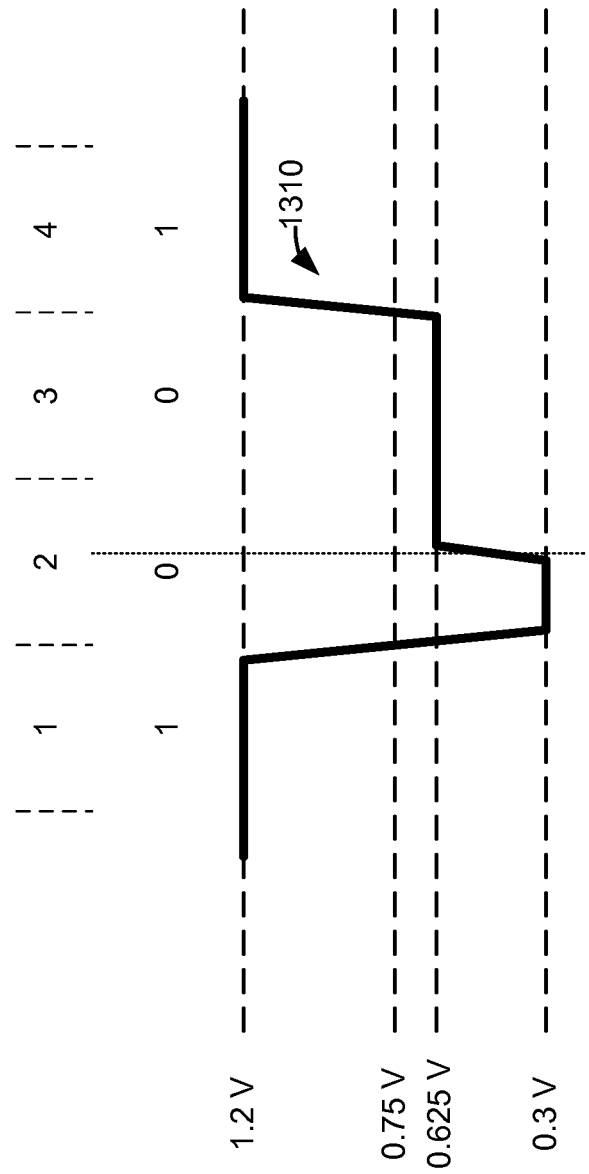
FIG. 13 is a timing diagram illustrating a first additional embodiment of a power saving signaling waveform.

FIG. 13 is a timing diagram illustrating a first additional embodiment of a power saving signaling waveform. In FIG. 13, a voltage waveform 1310 is shown for four bit periods numbered 1-4. A time series bit sequence of 1001 corresponding to data transmitted during bit periods 1-4, respectively, is shown in FIG. 13.

In FIG. 13, a voltage of 1.2 V in the waveform 1310 during bit period #1 represents the transmission of a logic "1". The transmission of a logic "0" is shown during bit period #2. During a first portion of bit period #2, a voltage of 0.3 V in the waveform 1310 represents a transition to the transmission of a logic "0". The remaining portion of bit period #2 is shown at a voltage of 0.625. During bit period #3, a voltage of 0.625 V in the waveform 1310 represents the consecutive transmission of a logic "0". During bit period #4, a voltage of 1.2 V in the waveform 1310 represents the transmission of a logic "1".

Figure 14:
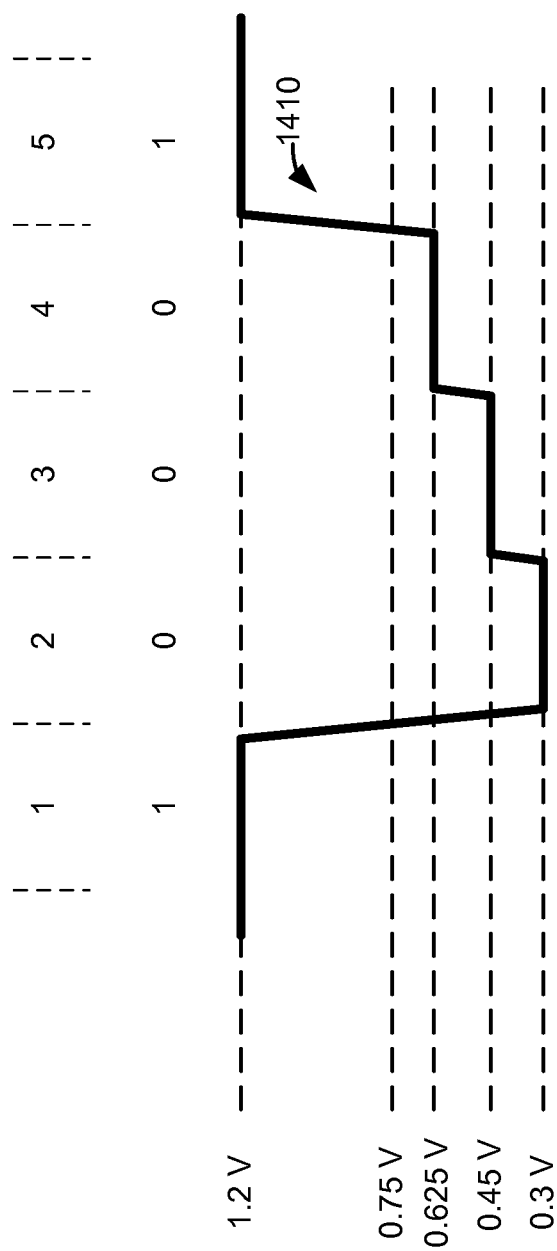
FIG. 14 is a timing diagram illustrating a second additional embodiment of a power saving signaling waveform.

FIG. 14 is a timing diagram illustrating a second additional embodiment of a power saving signaling waveform. In FIG. 14, a voltage waveform 1410 is shown for five bit periods numbered 1-5. A time series bit sequence of 10001 corresponding to data transmitted during bit periods 1-5, respectively, is shown in FIG. 14.

In FIG. 14, a voltage of 1.2 V in the waveform 1410 during bit period #1 represents the transmission of a logic "1". During bit period #2, a voltage of 0.3 V in the waveform 1410 represents a transition to the transmission of a logic "0". During bit period #3, a voltage of 0.45 V in the waveform 1410 represents the consecutive transmission of a logic "0". During bit period #4, a voltage of 0.625 V in the waveform 1410 represents the another consecutive transmission of a logic "0". During bit period #5, a voltage of 1.2 V in the waveform 1410 represents the transmission of a logic "1".

Figure 15:
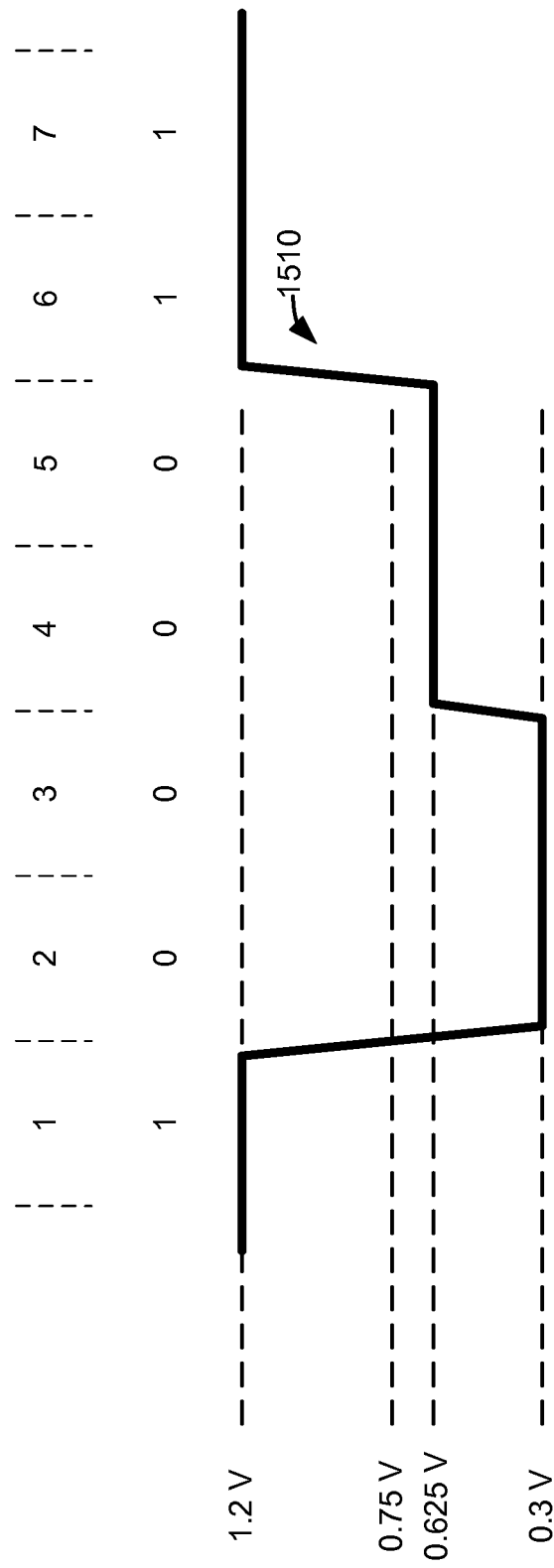
FIG. 15 is a timing diagram illustrating a third additional embodiment of a power saving signaling waveform.

FIG. 15 is a timing diagram illustrating a third additional embodiment of a power saving signaling waveform. In FIG. 15, a voltage waveform 1510 is shown for seven bit periods numbered 1-7. A time series bit sequence of 1000011 corresponding to data transmitted during bit periods 1-7, respectively, is shown in FIG. 15.

In FIG. 15, a voltage of 1.2 V in the waveform 1510 during bit period #1 represents the transmission of a logic "1". During bit period #2, a voltage of 0.3 V in the waveform 1510 represents a transition to the transmission of a logic "0". During bit period #3, the voltage of the waveform 1510 remains at 0.3 V to represent the second consecutive transmission of a logic "0". During bit period #4, a voltage of 0.625 V in the waveform 1410 represents a third consecutive transmission of a logic "0". During bit period #5, the voltage of the waveform 1510 remains at 0.625 V to represent a fourth consecutive transmission of a logic "0". During bit period #6, a voltage of 1.2 V in the waveform 1510 represents the transmission of a logic "1". During bit period #7, the voltage of the waveform 1510 remains at 1.2 V to represent the second consecutive transmission of a logic "1".

Figure 16:
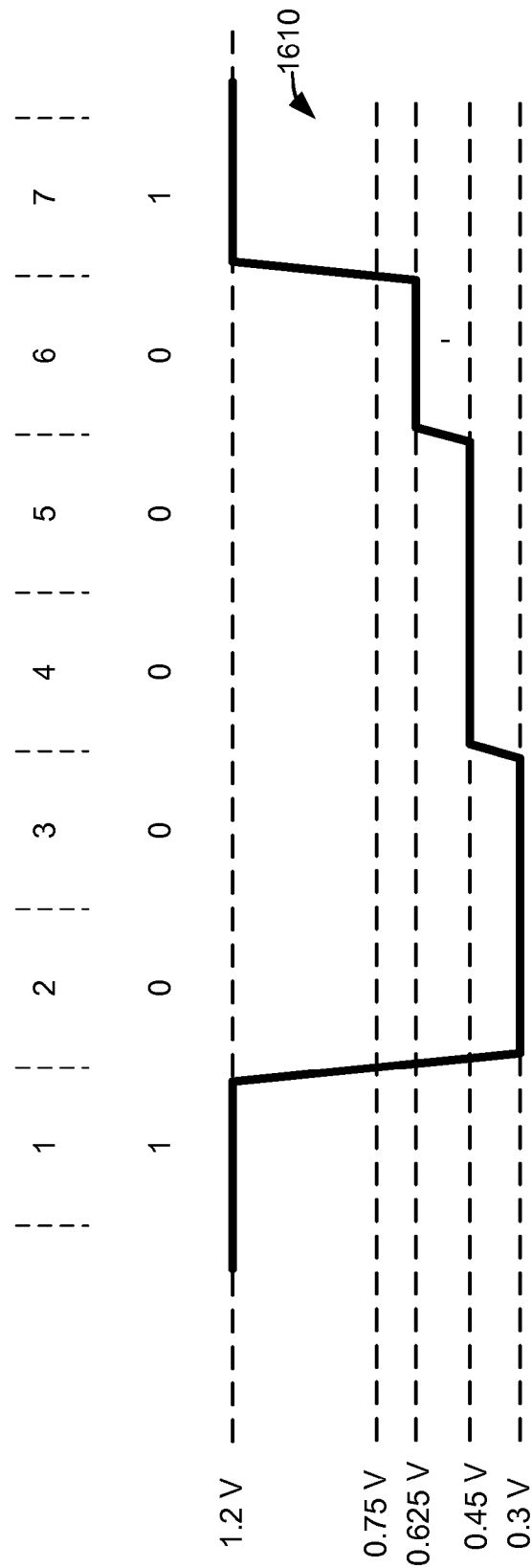
FIG. 16 is a timing diagram illustrating a fourth additional embodiment of a power saving signaling waveform.

FIG. 16 is a timing diagram illustrating a fourth additional embodiment of a power saving signaling waveform. In FIG. 16, a voltage waveform 1610 is shown for seven bit periods numbered 1-7. A time series bit sequence of 1000001 corresponding to data transmitted during bit periods 1-7, respectively, is shown in FIG. 16.

In FIG. 16, a voltage of 1.2 V in the waveform 1610 during bit period #1 represents the transmission of a logic "1". During bit period #2, a voltage of 0.3 V in the waveform 1610 represents a transition to the transmission of a logic "0". During bit period #3, the voltage of the waveform 1610 remains at 0.3 V to represent the second consecutive transmission of a logic "0". During bit period #4, a voltage of 0.45 V in the waveform 1610 represents a third consecutive transmission of a logic "0". During bit period #5, the voltage of the waveform 1610 remains at 0.45 V to represent a fourth consecutive transmission of a logic "0". During bit period #6, a voltage of 0.625 V in the waveform 1610 represents a third consecutive transmission of a logic "0". During bit period #7, a voltage of 1.2 V in the waveform 1610 represents the transmission of a logic "1".

Figure 17:
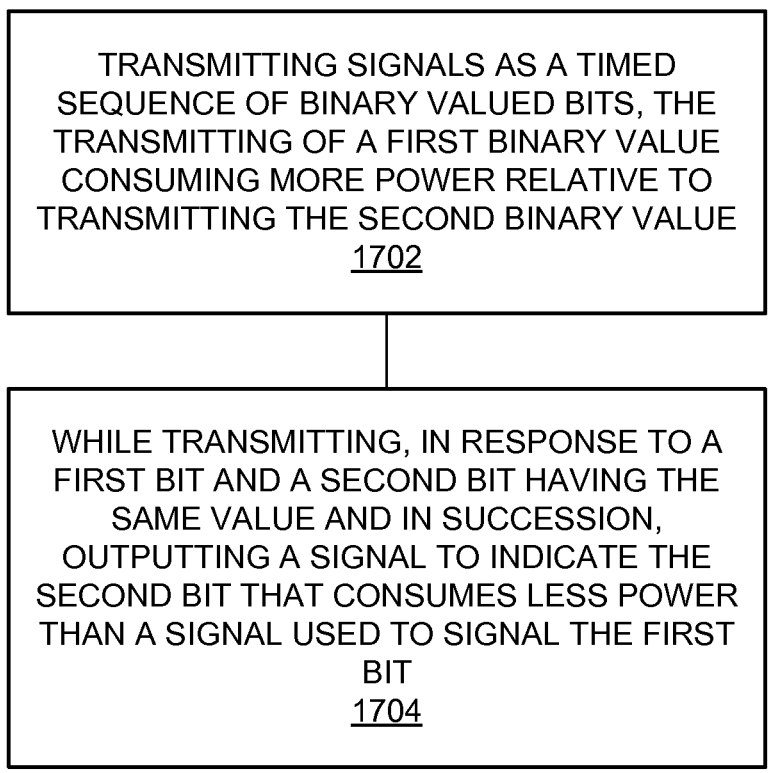
FIG. 17 is a flowchart illustrating a first embodiment of a method of operating an integrated circuit.

FIG. 17 is a flowchart illustrating a first embodiment method of operating an integrated circuit. The steps illustrated in FIG. 17 may be performed by one or more elements of system 100, system 300, system 500, memory system 700, and/or driver 800. Signals are transmitted as a timed sequence of binary valued bits where the transmitting of a first binary value consumes more power relative to transmitting the second binary value (1702). For example, driver 800 may transmit a time sequence of signals that represent a sequence of logic "0" or logic "1" bits. Driver 800 may consume more power to drive one of the binary values relative to driving the other (e.g., it may consume more current/power to drive a logic "1" than it takes to drive a logic "0").

While transmitting, in response to a first bit and a second bit having the same value and being in succession, a signal to indicate the second bit that consumes less power than a signal used to signal the first bit is output (1704). For example, while driving the time sequence of signals, driver 800 may drive the second bit of a pair of consecutive bits having the same value using a signal that consumes less power that the signal used for the first bit of the pair. Driver 800 may accomplish this by using a weaker drive strength for the second bit of the pair. The value selected may be the value that consumes more power to drive. In other words, for example, if it takes more power to drive a logic "0" than a logic "1", driver 800 may drive the second of a pair of consecutive "0"s in the timed sequence using a weaker drive strength, thereby consuming less current (and also thereby consuming less power).

Figure 18:
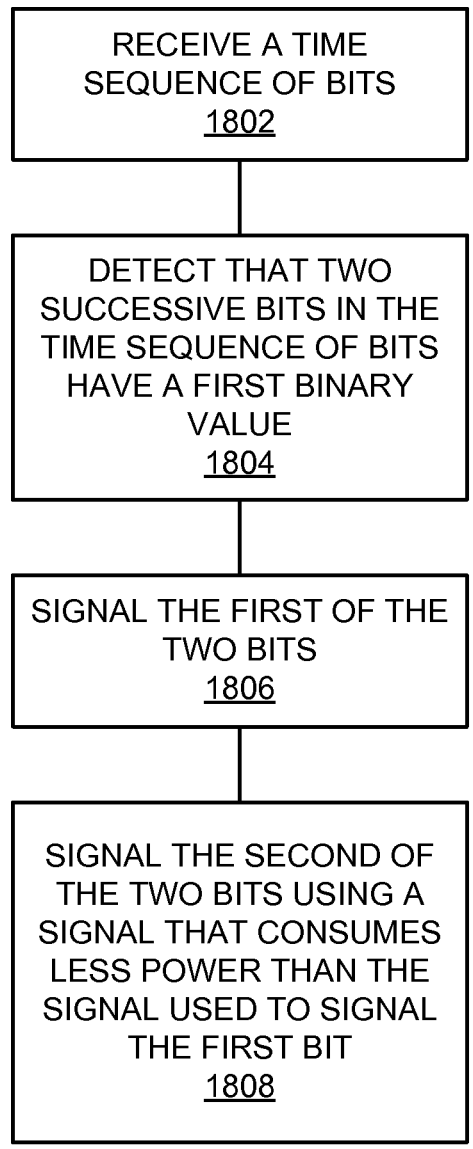
FIG. 18 is a flowchart illustrating a second embodiment of a method of operating an integrated circuit.

FIG. 18 is a flowchart illustrating a second embodiment method of operating an integrated circuit. The steps illustrated in FIG. 18 may be performed by one or more elements of system 100, system 300, system 500, memory system 700, and/or driver 800. A time sequence of bits is received (1802). For example, driver 800 (or control 820) may receive a time sequence of bits at input port D[X]. Two successive bits in the time sequence of bits having a first binary value are detected (1804). For example, control 820 may detect that two successive bits received at input port D[X] in successive bit periods have a predetermined binary value (i.e., the successive bits both are a pre-selected one of a "1" or "0").

The first of the two bits is signaled (1806). For example, control 820 may control one or more of drivers 810-812 to signal the first of the two bits using a first signaling level that consumes a first amount of power. The second of the two bits is signaled using a signal that consumes less power than the signal used to signal the first bit (1808). For example, control 820 may control one or more of drivers 810-812 to signal the second of the two bits using a second signaling level that consumes less than the first amount of power. It should be understood that additional successive bits after the second bit may be signaled using the second signaling level.

Figure 19:
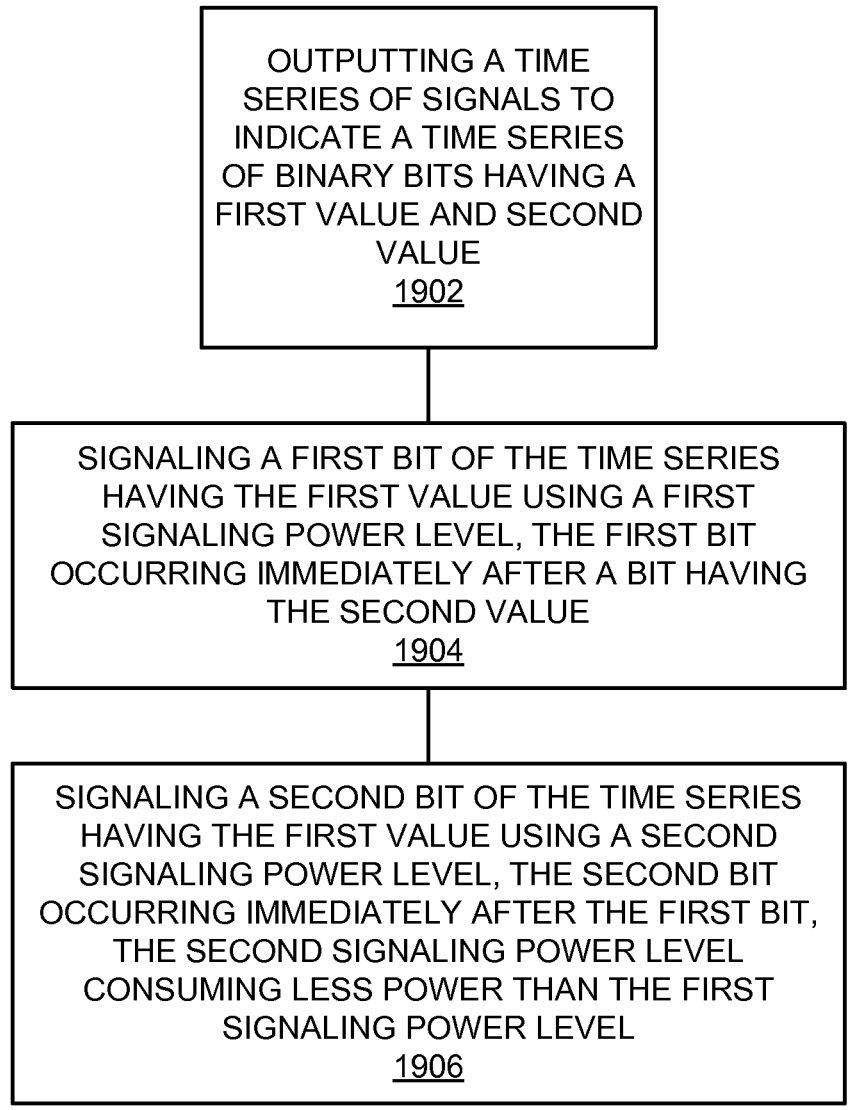
FIG. 19 is a flowchart illustrating a third embodiment of a method of operating an integrated circuit.

FIG. 19 is a flowchart illustrating a third embodiment method of operating an integrated circuit. The steps illustrated in FIG. 19 may be performed by one or more elements of system 100, system 300, system 500, memory system 700, and/or driver 800. A time series of signals is output to indicate a time series of binary bits having a first value and a second value (1902). For example, driver 800 (or control 820) may receive a time sequence of (logic "0" or logic "1") bits at input port D[X] and control one or more of drivers 810-812 to output a corresponding time sequence of signals to indicate the time sequence of bits.

A first bit of the time series, which has the first value, is signaled using a first signaling power level. The first bit occurring, in the time series, immediately after a bit having the second value (1904). For example, control 820 may control one or more of drivers 810-812 to signal the first bit after a transition to the first value (i.e., a pre-selected one of a logical "0" or logical "1") using a first signaling power level.

A second bit of the times series, which also has the first value, is signaled using a second signaling power level. The second bit occurring, in the time series, immediately after the first bit. The second signaling power level consuming less power than the first signaling power level (1906). For example, control 820 may control one or more of drivers 810-812 to signal the second consecutive bit with the first value after a transition using a second signaling power level that consumes less power than the first signaling power level. It should be understood that additional successive bits after the second bit may be signaled using the second signaling level, or optionally a third signaling level.

Figure 20:
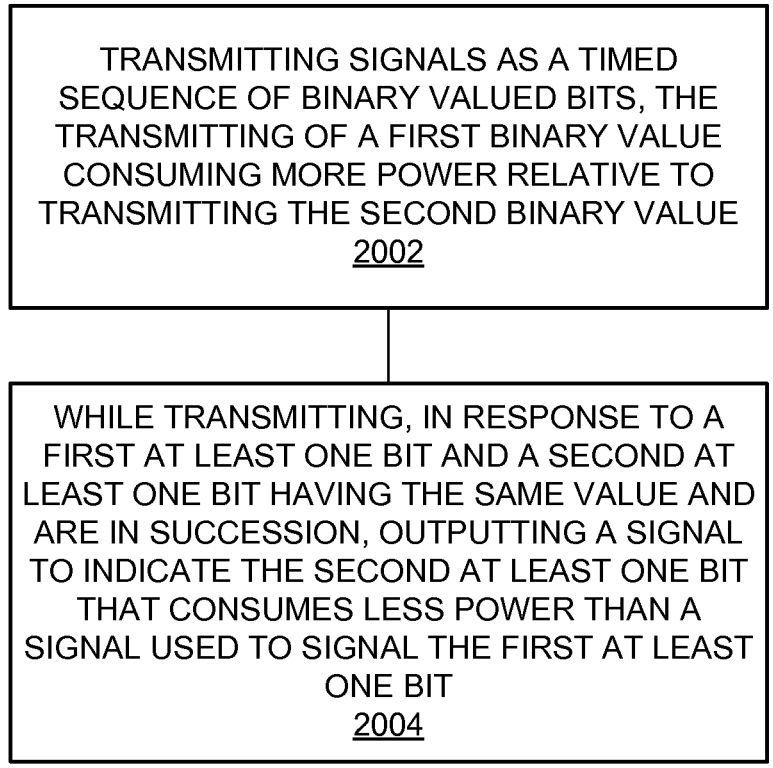
FIG. 20 is a flowchart illustrating a fourth embodiment of a method of operating an integrated circuit.

FIG. 20 is a flowchart illustrating a fourth embodiment method of operating an integrated circuit. The steps illustrated in FIG. 20 may be performed by one or more elements of system 100, system 300, system 500, memory system 700, and/or driver 800. Signals are transmitted as a timed sequence of binary valued bits where the transmitting of a first binary value consumes more power relative to transmitting the second binary value (2002). For example, driver 800 may transmit a time sequence of signals that represent a sequence of logic "0" or logic "1" bits. Driver 800 may consume more power to drive one of the binary values relative to driving the other (e.g., it may consume more current/power to drive a logic "1" than it takes to drive a logic "0").

While transmitting, in response to a first at least one bit and a second at least one bit having the same value and being in succession, a signal to indicate the second at least one bit that consumes less power than a signal used to signal the first bit is output (2004). For example, while driving the time sequence of signals, driver 800 may drive a later part of a series of consecutive bits having the same value using a signal that consumes less power that the signal used to drive an earlier part (e.g., first part) of a series of consecutive bits with the same value. Driver 800 may accomplish this by using a weaker drive strength for the later part of the series. The value selected for power saving may be the value that consumes more power to drive. In other words, for example, if it takes more power to drive a logic "0" than a logic "1", driver 800 may drive the later part of a series of consecutive "0"'s in the timed sequence using a weaker drive strength, thereby consuming less current (and also thereby consuming less power) than the drive strength used for the earlier part.

Figure 21:
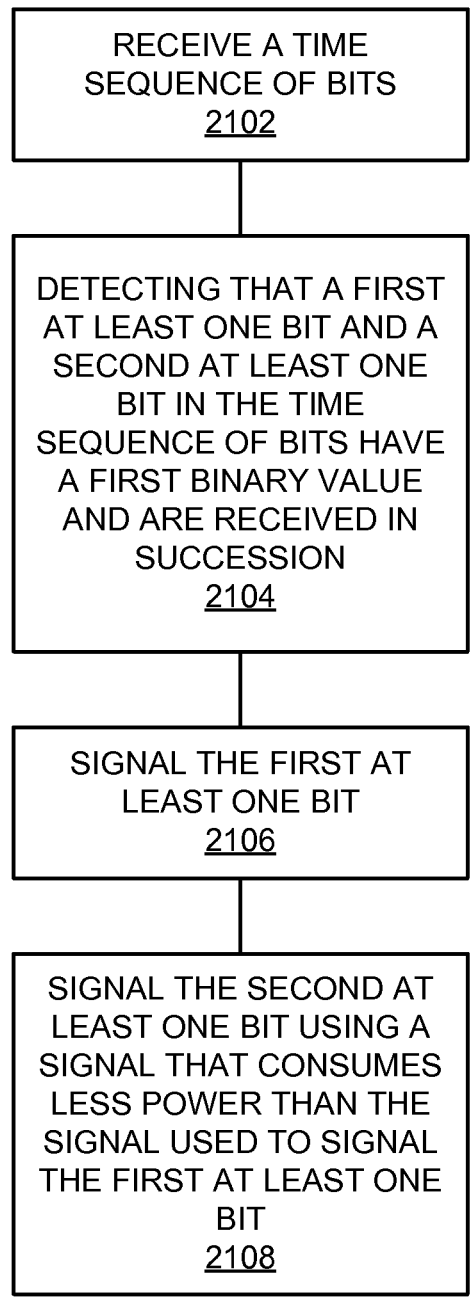
FIG. 21 is a flowchart illustrating a fifth embodiment of a method of operating an integrated circuit.

FIG. 21 is a flowchart illustrating a fifth embodiment method of operating an integrated circuit. The steps illustrated in FIG. 21 may be performed by one or more elements of system 100, system 300, system 500, memory system 700, and/or driver 800. A time sequence of bits is received (2102). For example, driver 800 (or control 820) may receive a time sequence of bits at input port D[X]. It is detected that a first at least one bit and a second at least one bit in the time sequence of bits have a first binary value and are received in succession (2104). For example, control 820 may detect that a first set of successive bits received at input port D[X] and a second set of successive bits received at input port D[X] have the same predetermined binary value and the two sets are not separated by any bits with the other binary value.

The first at least one bit is signaled (2106). For example, control 820 may control one or more of drivers 810-812 to signal the first set of successive bits using a first signaling level that consumes a first amount of power per bit. The second at least one bit is signaled using a signal that consumes less power than the signal used to signal the first at least one bit (2108). For example, control 820 may control one or more of drivers 810-812 to signal the second set of successive bits using a second signaling level that consumes less power per bit than the first amount of power per bit.

Figure 22:
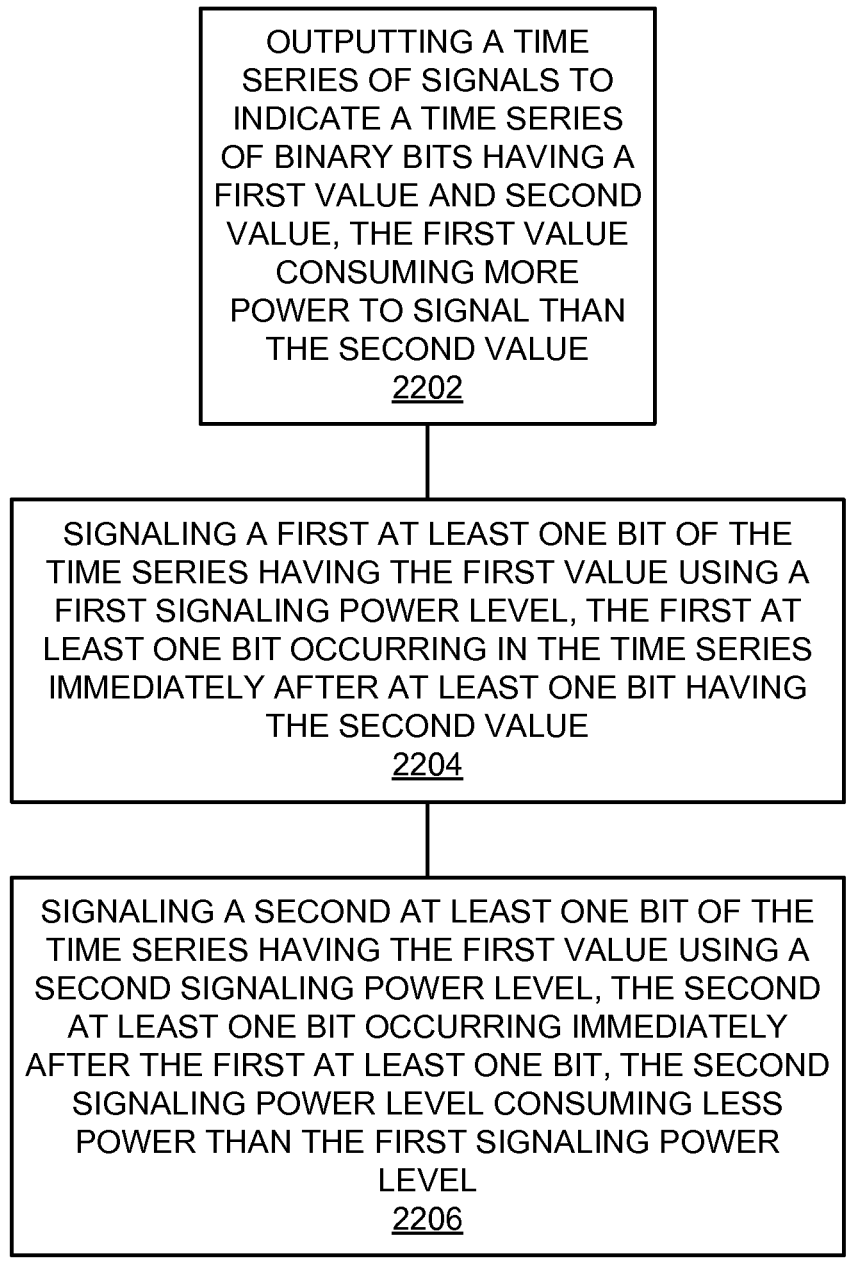
FIG. 22 is a flowchart illustrating a sixth embodiment of a method of operating an integrated circuit.

FIG. 22 is a flowchart illustrating a sixth embodiment method of operating an integrated circuit. The steps illustrated in FIG. 22 may be performed by one or more elements of system 100, system 300, system 500, memory system 700, and/or driver 800. A time series of signals is output to indicate a time series of binary bits having a first value and a second value. The first value consumes more power to signal than the second value (2202). For example, driver 800 (or control 820) may receive a time sequence of (logic "0" or logic "1") bits at input port D[X] and control one or more of drivers 810-812 to output a corresponding time sequence of signals to indicate the time sequence of bits where signaling a logic "1" (for example) consumes more power than signaling a logic "0".

A first at least one bit of the time series having the first value is signaled using a first signaling power level. The first at least one bit occurring in the time series immediately after at least one bit having the second value (2204). For example, control 820 may control one or more of drivers 810-812 to signal the first N occurrences of a logic "0" after at least one logic "1" is signaled using a first signaling power level, where N>=1. A second at least one bit of the time series having the first value is signaled using a second signaling power level. The second at least one bit occurring immediately after the first at least one bit. The second signaling power level consuming less power than the first signaling power level (2206). For example, control 820 may control one or more of drivers 810-812 to signal the next P occurrences of a logic "0" using a second signaling power level that consumes less power (per bit) than the first signaling power level, where P>=1 and the P occurrences of the logic "0" occur immediately after the N occurrences.

FIG. 23 is a flowchart illustrating a seventh embodiment method of operating an integrated circuit. The steps illustrated in FIG. 23 may be performed by one or more elements of system 100, system 300, system 500, memory system 700, and/or driver 800. A switching bit is signaled using a first signaling power level. The switching bit having a first binary value and occurring in a times series of bits immediately after a bit having a second binary value (2302). For example, driver 800 may signal the first logic "0" occurring after a logic "1" is signaled using a first signaling power level. A constant bit having the first binary value is signaled using a second signaling power level that consumes less power than the first signaling power level. The first constant bit occurring in the time series of bits immediately after the switching bit (2304).

For example, driver 800 may signal the second successive logic "0" occurring after the logic "1" is signaled using a second signaling power level.

FIG. 24 is a flowchart illustrating an eighth embodiment method of operating an integrated circuit. The steps illustrated in FIG. 24 may be performed by one or more elements of system 100, system 300, system 500, memory system 700, and/or driver 800. A switching bit is signaled using a first signaling power level. The switching bit having a first binary value and occurring in a times series of bits output by a signaling system immediately after a bit having a second binary value (2402). For example, driver 800 may signal the first logic "1" occurring after a logic "0" is signaled using a first signaling power level.

A first series of at least one constant bit having the first binary value is signaled using the first signaling power level. The first series of at least one constant bit occurring immediately after the switching bit (2404). For example, driver 800 may signal the next N logic "1"'s after the first logic "1" occurring after a logic "0" is signaled using the first signaling power level, where N>=1. A second series of at least one constant bit is signaled using a second signaling power level. The second signaling power level consuming less power than the first signaling power level. The second series of at least one constant bit having the first binary value and occurring immediately after the first series of at least one constant bit (2406). For example, driver 800 may signal the next P logic "1"'s occurring immediately after the first N logic "1"s using a second signaling power level, where P>=1. The second signaling power level consuming less power per bit than the first signaling power level.

FIG. 25 is a flowchart illustrating a ninth embodiment method of operating an integrated circuit. The steps illustrated in FIG. 25 may be performed by one or more elements of system 100, system 300, system 500, memory system 700, and/or driver 800. A first signaling level and a second signaling level are output. The first signaling level consuming more power than the second signaling level (2502). For example, as illustrated by waveform 1010 and 1030 in FIG. 10, driver 800 may output a signal voltage of $V_{B1}$ to signal a logic "1" and a signal voltage of $V_{B0}$ to signal a logic "0". As can be seen in FIG. 10, outputting a signal voltage of $V_{B1}$ consumes more power than outputting a signal voltage of $V_{B0}$.

The first signaling level is output at a first drive strength to signal a first bit value (2504). For example, driver 800 may use a first drive strength, which results in a signal voltage of $V_{B1}$ to signal a logic "1". Based on whether a second bit value to be signaled is the same as the first bit value, the first signaling level is driven at a second drive strength that consumes less power than the first driver strength (2506). For example, based on whether two consecutive logical "1"'s are driven, driver 800 may use a second drive strength that consumes less power (e.g., $PL_I$), which results in a signal voltage of $V_{BI}$ to signal a logic "1".

FIG. 26 is a flowchart illustrating a tenth embodiment method of operating an integrated circuit. The steps illustrated in FIG. 26 may be performed by one or more elements of system 100, system 300, system 500, memory system 700, and/or driver 800. A first indicator and a second indicator are provided to a driver such that a first signaling value and a second signaling value are to be driven in successive signaling periods (2602). For example, memory controller 710 or memory 720 may provide indicators to drivers 713 or drivers 723, respectively, indicators that indicate two consecutive "0"'s should be driven in successive bit periods.

Based on the first indicator and the second indicator having the same value, a first drive strength of a driver is adjusted to drive the first signaling value without adjusting the drive strength of the driver to drive a second signaling value (2604). For example, memory controller 710 or memory 720 may adjust the drive strength used for the second of the consecutive "0"'s without adjusting the drive strength used to drive the first of the consecutive "0"'s.

FIG. 27 is a flowchart illustrating an eleventh embodiment method of operating an integrated circuit. The steps illustrated in FIG. 27 may be performed by one or more elements of system 100, system 300, system 500, memory system 700, and/or driver 800. A first indicator and a second indicator are received such that a first signaling value and a second signaling value are to be driven in successive signaling periods (2702). For example, driver 800 may receive indicators on input port D[X] that indicate two consecutive "0"'s should be driven in successive bit periods.

Based on the first indicator and the second indicator having the same value, a first drive strength of a driver is adjusted to drive the first signaling value without adjusting the drive strength of the driver to drive a second signaling value (2704). For example, driver 800 may adjust the drive strength used for the second of the consecutive "0"'s without adjusting the drive strength driver 800 uses to drive the first of the consecutive "0"'s.

Figure 28:
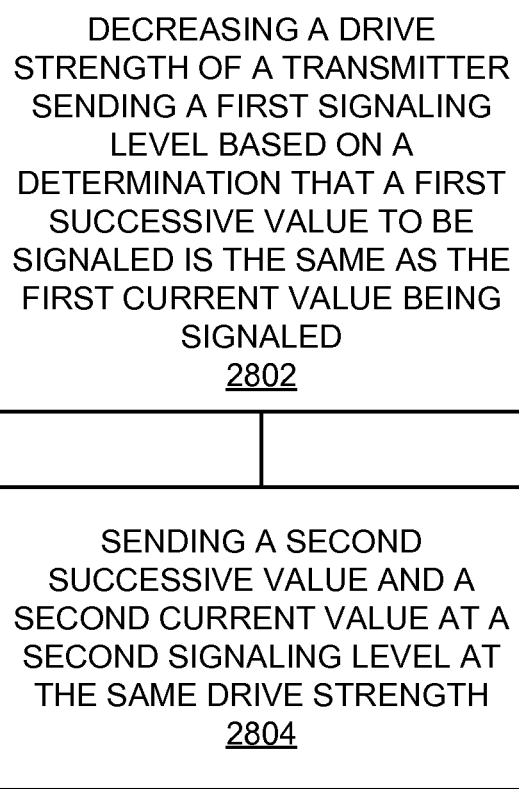
FIG. 28 is a flowchart illustrating a twelfth embodiment of a method of operating an integrated circuit.

FIG. 28 is a flowchart illustrating a twelfth embodiment method of operating an integrated circuit. The steps illustrated in FIG. 28 may be performed by one or more elements of system 100, system 300, system 500, memory system 700, and/or driver 800. A drive strength of a transmitter sending a first signaling level is decreased based on a determination that a first successive value to be signaled is the same as the first current value being signaled (2802). For example, driver 800 may decrease the drive strength it will use to send the next logical "0" based on a determination that it is currently sending a logical "0".

A second successive value and a second current value are sent at the same drive strength (2804). For example, driver 800 may send all instances of consecutive logical "1"'s using the same drive strength.

Figure 29:
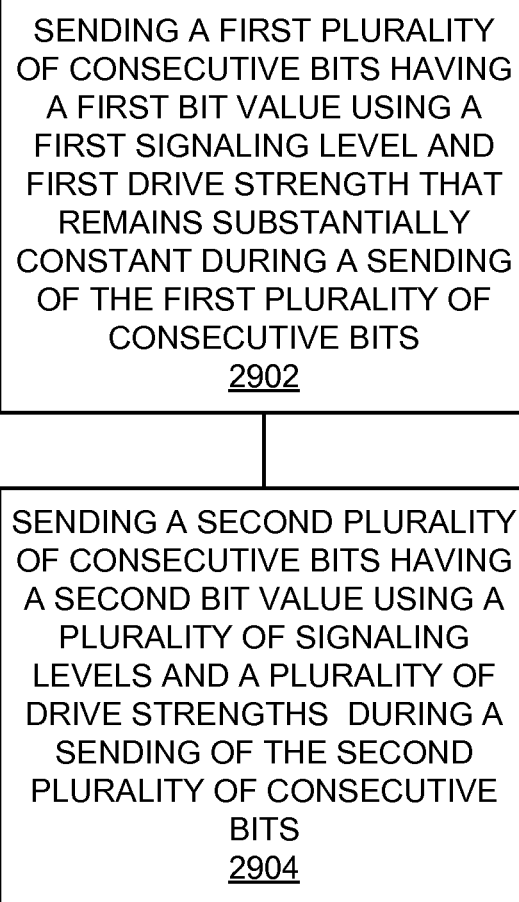
FIG. 29 is a flowchart illustrating a thirteenth embodiment of a method of operating an integrated circuit.

FIG. 29 is a flowchart illustrating a thirteenth embodiment method of operating an integrated circuit. The steps illustrated in FIG. 29 may be performed by one or more elements of system 100, system 300, system 500, memory system 700, and/or driver 800. A first plurality of consecutive bits having a first bit value are sent using a first signaling level and first drive strength that remains substantially constant during a sending of the first plurality of consecutive bits (2902). For example, driver 800 may send all instances of consecutive logical "1"'s using the substantially the same drive strength.

A second plurality of consecutive bits having a second bit value is sent using a plurality of signaling levels and a plurality of drive strengths during a sending of the second plurality of consecutive bits (2904). For example, driver 800 may send strings of consecutive logical "0"'s using successively weaker drive strengths that result is successively different voltages on its output.

The systems and devices described above may be implemented in computer systems, integrated circuits, or stored by computer systems. The systems described above may also be stored on a non-transitory computer readable medium. Devices, circuits, and systems described herein may be implemented using computer-aided design tools available in the art, and embodied by computer-readable files containing software descriptions of such circuits. This includes, but is not limited to one or more elements of system 100, system 300, system 500, memory system 700, driver 800, and their components. These software descriptions may be: behavioral, register transfer, logic component, transistor, and layout geometry-level descriptions. Moreover, the software descriptions may be stored on non-transitory storage media or communicated by carrier waves.

Data formats in which such descriptions may be implemented include, but are not limited to: formats supporting behavioral languages like C, formats supporting register transfer level (RTL) languages like Verilog and VHDL, formats supporting geometry description languages (such as GDSII, GDSIII, GDSIV, CIF, and MEBES), and other suitable formats and languages. Moreover, data transfers of such files on machine-readable media may be done electronically over the diverse media on the Internet or, for example, via email. Note that physical files may be implemented on machine-readable media such as: 4 mm magnetic tape, 8 mm magnetic tape, 3½ inch floppy media, CDs, DVDs, Blu-Ray, and so on.

Figure 30:
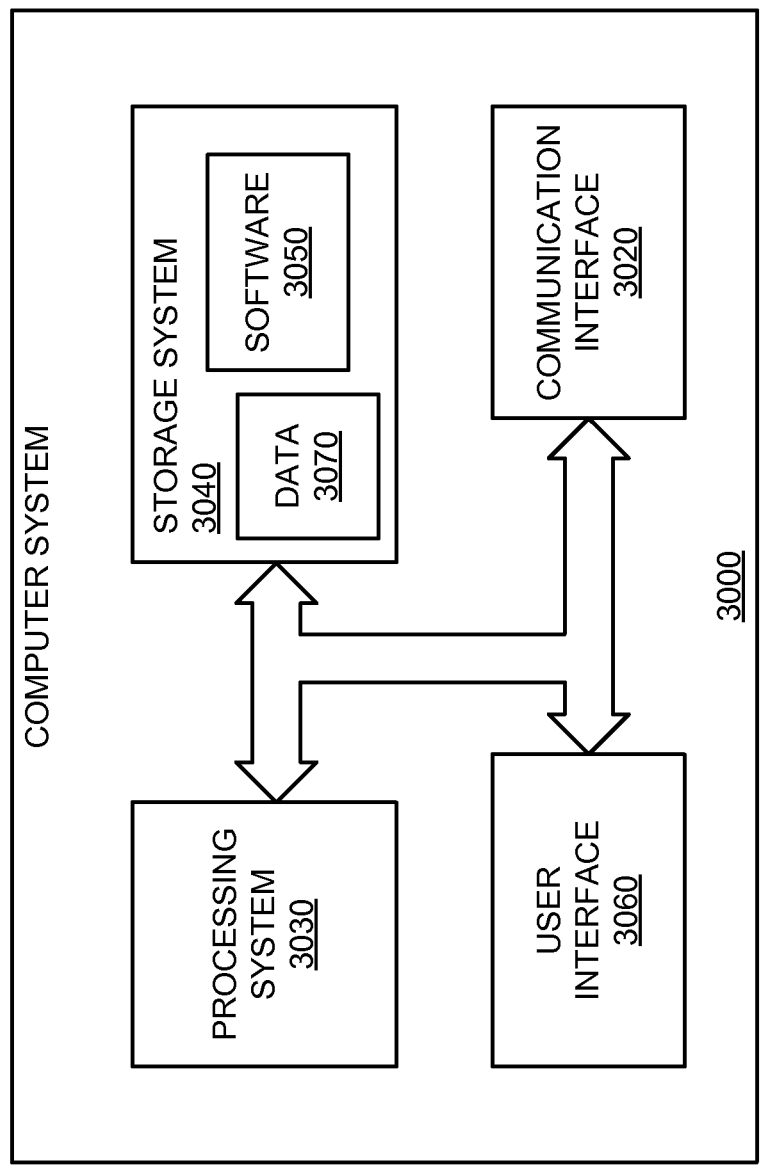
FIG. 30 is a block diagram illustrating a computer system.

FIG. 30 illustrates a block diagram of a computer system. Computer system 3000 includes communication interface 3020, processing system 3030, storage system 3040, and user interface 3060. Processing system 3030 is operatively coupled to storage system 3040. Storage system 3040 stores software 3050 and data 3070. Computer system 3000 may include one or more of system 100, system 300, system 500, memory system 700, driver 800, or components that implement the methods, circuits, and/or waveforms described herein. Processing system 3030 is operatively coupled to communication interface 3020 and user interface 3060. Computer system 3000 may comprise a programmed general-purpose computer. Computer system 3000 may include a microprocessor. Computer system 3000 may comprise programmable or special purpose circuitry. Computer system 3000 may be distributed among multiple devices, processors, storage, and/or interfaces that together comprise elements 3020-3070.

Communication interface 3020 may comprise a network interface, modem, port, bus, link, transceiver, or other communication device. Communication interface 3020 may be distributed among multiple communication devices. Processing system 3030 may comprise a microprocessor, microcontroller, logic circuit, or other processing device. Processing system 3030 may be distributed among multiple processing devices. User interface 3060 may comprise a keyboard, mouse, voice recognition interface, microphone and speakers, graphical display, touch screen, or other type of user interface device. User interface 3060 may be distributed among multiple interface devices. Storage system 3040 may comprise a disk, tape, integrated circuit, RAM, ROM, EEPROM, flash memory, network storage, server, or other memory function. Storage system 3040 may include computer readable medium. Storage system 3040 may be distributed among multiple memory devices.

Processing system 3030 retrieves and executes software 3050 from storage system 3040. Processing system 3030 may retrieve and store data 3070. Processing system 3030 may also retrieve and store data via communication interface 3020. Processing system 3030 may create or modify software 3050 or data 3070 to achieve a tangible result. Processing system 3030 may control communication interface 3020 or user interface 3060 to achieve a tangible result. Processing system 3030 may retrieve and execute remotely stored software via communication interface 3020.

Software 3050 and remotely stored software may comprise an operating system, utilities, drivers, networking software, and other software typically executed by a computer system. Software 3050 may comprise an application program, applet, firmware, or other form of machine-readable processing instructions typically executed by a computer system. When executed by processing system 3030, software 3050 or remotely stored software may direct computer system 3000 to operate.

The above description and associated figures teach the best mode of the invention. The following claims specify the scope of the invention. Note that some aspects of the best mode may not fall within the scope of the invention as specified by the claims. Those skilled in the art will appreciate that the features described above can be combined in various ways to form multiple variations of the invention. As a result, the invention is not limited to the specific embodiments described above, but only by the following claims and their equivalents.

What is claimed is:

1. A method of operating an integrated circuit, comprising:
at a transmitter circuit, transmitting signals as a timed sequence of binary valued bits, the binary valued bits including a first binary value and a second binary value, the transmitting of the first binary value consuming more power relative to transmitting the second binary value;
the transmitting of signals to indicate the time sequence of binary valued bits comprising:
in response to a first at least one bit and a second at least one bit that all have the first binary value and are in succession in the time sequence of binary valued bits, outputting a signal to indicate the second at least one bit that consumes less power than a signal used to signal the first at least one bit.

2. The method of claim 1, wherein the transmitting of signals to indicate the time sequence of binary valued bits further comprises:
in response to the first at least one bit, the second at least one bit, and a third at least one bit that all have the first binary value and are in succession in the time sequence of binary valued bits, outputting a signal to indicate the third at least one bit that consumes less power than a signal used to signal the first at least one bit.

3. The method of claim 1, wherein the transmitting of signals to indicate the time sequence of binary valued bits further comprises:
in response to the first at least one bit, the second at least one bit, and a third at least one bit that all have the first binary value and are in succession, outputting a signal to indicate the third at least one bit that consumes less power than a signal used to signal the second at least one bit.

4. The method of claim 1, wherein the first at least one bit is in succession in the time sequence of binary values immediately after at least one bit having the second binary value.

5. The method of claim 1, wherein a variable strength driver is controlled to output the signal used to signal the first at least one bit and the signal to indicate the second at least one bit.

6. The method of claim 5, wherein the variable strength driver outputs the signal used to signal the first at least one bit using a first signaling level and first drive strength that remains substantially constant during an outputting of the first at least one bit.

7. The method of claim 6, wherein the variable strength driver outputs the signal used to signal the second at least one bit using a plurality of signaling levels and a plurality of drive strengths that adjust during an outputting of the second at least one bit.

8. An integrated circuit, comprising:
an output driver to transmit signals to indicate a time sequence of binary valued bits comprising a first binary value and a second binary value, the first binary value consuming more power to transmit than the second binary value; and, driver control circuitry to, in response to a first at least one bit and a second at least one bit that all have the first binary value and are in succession, control the output driver to transmit a signal to indicate the second at least one bit that consumes less power than a signal used to transmit the first at least one bit.

9. The integrated circuit of claim 8, wherein the driver control circuitry is to, in response to the first at least one bit, the second at least one bit, and a third at least one bit that all have the first binary value and are in succession, control the output driver to transmit a signal to indicate the third at least one bit that consumes less power than a signal used to transmit the first at least one bit.

10. The integrated circuit of claim 8, wherein the driver control circuitry is to, in response to the first at least one bit, the second at least one bit, and a third at least one bit that all have the first binary value and are in succession, control the output driver to transmit a signal to indicate the third at least one bit that consumes less power than a signal used to transmit the second at least one bit.

11. The integrated circuit of claim 8, wherein the first at least one bit is to be in succession in the time sequence of binary values immediately after at least one bit having the second binary value.

12. The method of claim 8, wherein the driver control circuitry controls a variable strength driver to transmit the signal to indicate the second at least one bit that consumes less power than the signal used to transmit the first at least one bit.

13. The method of claim 12, wherein the variable strength driver outputs a signal used to transmit the first at least one bit using a first signaling level and first drive strength that remains substantially constant during an outputting of the first at least one bit.

14. The method of claim 13, wherein the variable strength driver outputs a signal used to transmit the second at least one bit using a plurality of signaling levels and a plurality of drive strengths that adjust during an outputting of the second at least one bit.

15. A method of operating an integrated circuit, comprising:

outputting a time series of signals to indicate a time series of binary valued bits, a first binary value consuming more power to signal than a second binary value;

wherein a first bit having the first binary value is signaled using a first signaling power level, the first bit occurring in the time series of binary valued bits immediately after a bit having the second binary value; and, wherein a second bit having the first binary value is signaled using a second signaling power level, the second bit occurring in the time series of binary valued bits immediately after the first bit, the second signaling power level consuming less power than the first signaling power level.

16. The method of claim 15, wherein a third bit having the first binary value is signaled using the second signaling power level, the third bit occurring in the time series of binary valued bits immediately after the second bit.

17. The method of claim 15, wherein a third bit having the first binary value is signaled using a third signaling power level, the third bit occurring in the time series of binary valued bits immediately after the second bit, the third signaling power level consuming less power than the second signaling power level.

18. The method of claim 15, further comprising:

controlling a variable strength driver to signal using the first signaling power level and to signal using the second signaling power level.

19. The method of claim 18, wherein the variable strength driver signals the second binary value using a first signaling level and first drive strength that remains substantially constant during a signaling of the second binary value.

20. The method of claim 19, wherein the variable strength driver signals the first binary value using a plurality of signaling levels and a plurality of drive strengths that adjust during an outputting of the first bit and the second bit.

* * * * *